United States Patent
Robison et al.

(10) Patent No.: US 7,744,735 B2
(45) Date of Patent: Jun. 29, 2010

(54) IONIZED PVD WITH SEQUENTIAL DEPOSITION AND ETCHING

(75) Inventors: Rodney Lee Robison, Mesa, AZ (US); Jacques Faguet, Gilbert, AZ (US); Bruce Gittleman, Scottsdale, AZ (US); Tugrul Yasar, Scottsdale, AZ (US); Frank Cerio, Phoenix, AZ (US); Jozef Brcka, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 1125 days.

(21) Appl. No.: 10/795,093

(22) Filed: Mar. 5, 2004

(65) Prior Publication Data

US 2004/0188239 A1 Sep. 30, 2004

(51) Int. Cl.
C23C 14/00 (2006.01)
C23C 14/32 (2006.01)
C25B 11/00 (2006.01)
C25B 13/00 (2006.01)

(52) U.S. Cl. ............................. 204/298.16; 204/192.1; 204/192.13; 204/192.33; 204/298.01; 204/298.03; 204/298.17; 204/298.2; 204/298.22; 204/298.32; 204/298.37

(58) Field of Classification Search .............. 204/192.1, 204/192.12, 192.15, 192.17, 192.3, 298.06, 204/298.11, 298.22
See application file for complete search history.

(56) References Cited

U.S. PATENT DOCUMENTS 4,664,935 A 5/1987 Strahl .................... 204/192.12
4,859,908 A * 8/1989 Yoshida et al. ......... 315/111.81
4,999,096 A 3/1991 Nihei et al. ............... 204/192.3
5,130,005 A * 7/1992 Hurwitt et al. ......... 204/192.12
5,576,600 A * 11/1996 McCrary et al. ....... 315/111.81
5,658,438 A 8/1997 Givens et al. .......... 204/192.11
5,948,215 A * 9/1999 Lantsman .............. 204/192.12

(Continued)

FOREIGN PATENT DOCUMENTS

WO WO 99/57746 11/1999

(Continued)

*Primary Examiner*—Alexa D Neckel
*Assistant Examiner*—Michael Band
(74) *Attorney, Agent, or Firm*—Wood, Herron & Evans, L.L.P.

(57) ABSTRACT

An iPVD apparatus (20) is programmed to deposit material (10) onto semiconductor substrates (21) by cycling between deposition and etch modes within a vacuum chamber (30). Static magnetic fields are kept to a minimum during at least the etch modes, at least less than 150 Gauss, typically less than 50 Gauss, and preferably in the range of 0-10 Gauss. Static magnetic fields during deposition modes may be more than 150 Gauss, in the range of 0-50 Gauss, or preferably 20-30 Gauss, and may be the same as during etch modes or switched between a higher level during deposition modes and a lower level, including zero, during etch modes. Such switching may be by switching electromagnet current or by moving permanent magnets, by translation or rotation. Static magnetic fields are kept to a minimum during at least the etch modes, at least less than 150 Gauss, typically less than 50 Gauss, and preferably in the range of 1-10 Gauss. The modes may operate at different power and pressure parameters. Pressure of more than 50 mTorr are preferred for deposition in a thermalized plasma while pressure of less than a few mTorr is preferred for etching.

30 Claims, 11 Drawing Sheets

U.S. PATENT DOCUMENTS

| | | | | |
|---|---|---|---|---|
| 5,997,699 A * | 12/1999 | Leiphart | ........... | 204/192.3 |
| 6,042,700 A * | 3/2000 | Gopalraja et al. | ...... | 204/192.15 |
| 6,051,114 A * | 4/2000 | Yao et al. | ........... | 204/192.3 |
| 6,080,287 A | 6/2000 | Drewery et al. | ........ | 204/192.15 |
| 6,100,200 A | 8/2000 | Van Buskirk et al. | ....... | 438/697 |
| 6,106,677 A | 8/2000 | Sandhu | ........... | 204/192.3 |
| 6,132,564 A | 10/2000 | Licata | ........... | 204/192.15 |
| 6,197,165 B1 | 3/2001 | Drewery et al. | ........ | 204/192.12 |
| 6,197,167 B1 | 3/2001 | Tanaka | ........... | 204/192.15 |
| 6,254,745 B1 * | 7/2001 | Vukovic | ........... | 204/298.06 |
| 6,274,008 B1 | 8/2001 | Gopalraja et al. | ...... | 204/192.17 |
| 6,277,249 B1 * | 8/2001 | Gopalraja et al. | ...... | 204/192.12 |
| 6,287,435 B1 | 9/2001 | Drewery et al. | ........ | 204/298.09 |
| 6,287,977 B1 * | 9/2001 | Hashim et al. | ........... | 438/722 |
| 6,299,740 B1 * | 10/2001 | Hieronymi et al. | ..... | 204/192.12 |
| 6,328,865 B2 * | 12/2001 | Matsumoto et al. | .... | 204/298.26 |
| 6,458,252 B1 | 10/2002 | Russell | ........... | 204/192.12 |
| 6,475,356 B1 | 11/2002 | Ngan et al. | ........... | 204/192.17 |
| 6,755,945 B2 * | 6/2004 | Yasar et al. | ........... | 204/192.3 |

FOREIGN PATENT DOCUMENTS

| | | |
|---|---|---|
| WO | WO 00/05745 | 2/2000 |
| WO | WO 00/07236 | 2/2000 |
| WO | WO 02/091461 A2 | 11/2002 |

* cited by examiner

IONIZED PVD WITH SEQUENTIAL DEPOSITION AND ETCHING

This application is related to U.S. patent application Ser. No. 10/138,049 filed May 3, 2002, and is related to U.S. Provisional Patent Application Ser. No. 60/288,952, filed May 4, 2001, both hereby expressly incorporated herein by reference.

FIELD OF THE INVENTION

This invention relates to the metallization of via and trench structures on semiconductor wafers. More particularly, the invention relates to the metallization of high aspect ratio via and trench structures of silicon wafers utilizing ionized sputtered materials to form the barrier and seed layers.

BACKGROUND OF THE INVENTION

In the metallization of high aspect ratio (HAR) via holes and trenches on semiconductor wafers, it is required that the barrier layer and the seed layer have good sidewall and bottom coverage. The barrier layer needs to be as thin as possible without sacrificing its barrier properties. The barrier layer must be thin because its electrical resistance, which adds to the electrical resistance of the via structure, must be minimized. It needs to be conformal and continuous to prevent diffusion of seed layer material into the dielectric layer and into other layers to prevent reliability problems. This requires that the barrier layer thickness must be well controlled and minimized especially at the bottom of the via. A thick barrier layer at the bottom of the via may add substantial undesirable electrical resistance to the resistance of interconnect metallization. High contact resistance results in inferior IC performance. During barrier layer deposition, at the top edges of the via's entrance, an overhang may form due to buildup of thicker material there. This overhang interferes with the deposition of the seed layer onto the sidewalls and the bottom of the via. During seed layer deposition, further overhang formation by the seed layer material itself must be prevented.

The seed layer must be continuous and have good coverage at the sidewalls and at the bottom of the vias. This is essential for the electroplating step which follows the barrier and seed layer deposition. The closure of the via entrance by overhang results in poor sidewall coverage, poor electroplated fill and low device yields.

Ionized PVD has been utilized in semiconductor processing for metallization and interconnects where it promises to extend performance to 65 nanometer or lower submicron technology. In the metallization of high aspect ratio (HAR) via holes and trenches on semiconductor wafers, the barrier layer and the seed layer must have good sidewall and bottom coverage across the wafer. Ionized PVD deposition is used for barrier and seed layer metallization in advanced IC wafers. Ionized PVD provides good sidewall and bottom coverage in via and trench structures. However, the ionized deposition requirements become more critical as the geometries shrink and as the via dimensions decrease below 0.15 micrometers. Therefore, it is highly desirable to have a processing system where bottom and sidewall coverage are well balanced and overhang is minimized.

Sequential deposition and etch processes have been proposed previously. In U.S. Pat. No. 6,100,200, Van Buskirk, et al. teach a sequentially performed heated deposition and etch unit process to provide conformal coverage of via or trench structures. However, they teach deposition and etch processes at high substrate temperatures between 300-600° C. Unfortunately, the new state-of-the-art low-k dielectrics that are used in current semiconductor processes require temperatures<200° C. Cu seed layer deposition requires <0° C., typically −20° C. to −50° C. to prevent copper agglomeration. The temperatures taught by Van Buskirk, et al. would result in total agglomeration of Cu seed layers, overhang and closure of via and trenches with large islands of Cu and discontinuous Cu layers. Van Buskirk, et al. also teaches low power sputtering typically less than 1 kW and particularly less than 0.5 kW. This puts severe deposition rate and throughput limitations on the process.

Furthermore, Van Buskirk, et al. teach sequential deposition and etching steps to be carried out in a singular vacuum system by transporting the wafer between dedicated deposition and etch modules, or in a singular vacuum system using a multi-faceted deposition and reactive ion etch module. Alternatively, Van Buskirk et al. suggests the steps may be carried out in independent deposition and etch systems. Transferring the wafer from one etch chamber to another deposition chamber or from an etch station to another deposition station within the same module has disadvantages both from cost of process and quality of process points of view. By transferring wafers from chamber to chamber or from one station to another station in the same chamber, loss of throughput results, and thus a more costly process. Some processes are sensitive to adsorption of gas molecules or other contaminants during transfer, which may be detrimental to the quality and reliability of the devices under construction. Another suggestion of Van Buskirk, et al. is to carry out the deposition and etch steps in independent systems with exposure to atmosphere in between processes, is totally unacceptable in most of the modern barrier/seed layer metallization processes. Van Buskirk, et al. also do not teach any substrate bias during the deposition step.

In U.S. Pat. No. 4,999,096, Nikei, et al. teach a method of and apparatus for sputtering when sequential deposition and etching in the same chamber can be performed. Nikei, et al. applies a negative voltage alternatively to a target and a substrate to perform film deposition and reverse sputter alternately. They teach an RF coil internal to the process module, situated between the target and substrate, to cause plasma generation for the etch step. This configuration has a significant disadvantage in that the internal coil is a source of contamination because it is well known in the art that energetic ions and neutrals that exist in the process space will also remove material from, i.e., etch, the coils and contaminate the film being deposited or etched on the substrate. In other prior art, the coil can be made from the same material that is being deposited, but this creates undue economic and hardware difficulties for the process. Not every material to be deposited is amenable to construct a coil and most of the time the cost is prohibitive. Furthermore, the suggestions of Nikei, et al. will result in non-uniform plasma generation and non-uniform etching of the substrate. It is essential in a sequential etching and deposition process that both steps be uniform across the wafer to result in a uniformly processed wafer at the end of the process.

Nikei, et al. strictly teach and emphasize a low pressure deposition and etching process to prevent impurity inclusion in the deposited films. This is achieved by creating the plasma at low pressure, such as on the order of $10^{-3}$ torr or less during the etch and deposition process. During the etch process the internal coil needs to be RF powered to achieve a discharge which, contrary to their desire to keep certain contaminants from the substrate, now contributes contaminants to the substrate. Nikei, et al. strictly teach or limit their invention to low pressure ($10^{-3}$ torr or less) operation.

U.S. Pat. No. 6,274,008, Gopalraja, et al. teaches an integrated copper fill process where a simultaneous clean-deposit step is carried out. This invention uses copper ions to clean and/or etch the bottom of via structures before the copper seed layer is deposited.

Furthermore, performing deposition and etching in the same chamber, as proposed by Nikei, et al. and generally, subject one or both of the deposition or etch processes to conditions that, while suitable for the other process, are detrimental. For example, magnetic fields that are important to achieving high deposition as well as target utilization and erosion uniformity during the deposition process can adversely affect the efficiency or uniformity of an etch process performed in a chamber equipped with magnets selected to optimize the deposition.

SUMMARY OF THE INVENTION

An objective of the present invention is to provide for the metallization of interconnects and other deposition onto substrates having submicron high aspect ratio features. A particular objective of the present invention is to generate material vapor without negatively effecting overall plasma source performance.

According to principles of the present invention, a process and an apparatus are provided wherein sequential deposition and etching steps are used to solve the problems set forth above. According to exemplary embodiments of the invention, a process is provided that involves first depositing a thin layer of metallization, for example, tantalum (Ta), tantalum nitride (TaN) or copper (Cu), and then, preferably after stopping the deposition, performing an ion etch step, preferably by ionized gas, for example, argon (Ar).

The etching step removes less material on both the field area on the top surface of the wafer and the via bottom than is deposited during the deposition step, and thus there is net deposition at the end of the process cycle. The deposition/etch cycle can be repeated as many times as needed to achieve the desired result. By balancing the deposition and etching times, rates and other deposition and etch parameters, the overhang growth is eliminated or minimized. The overhang and bottom deposition is etched back and redistributed at least partially to the sidewalls.

In the process according to one embodiment of the invention, material is deposited onto a wafer having small high aspect ratio features, for example, holes or vias of diameters of 0.15 micrometers or less with aspect ratios of from three or five, to fifteen or higher. While advantages of the invention are also useful for features of 1 or 0.5 micron diameter and lower, and for aspect ratios of 1 to 1 or 2 to 1, the invention becomes most useful as features become smaller and smaller, to 65 or 50 nanometer diameters or smaller, or as aspect ratios become larger.

The deposition uses an ionized physical vapor deposition (iPVD) process and apparatus having the features as described in U.S. Pat. Nos. 6,287,435; 6,080,287; 6,197,165; 6,132,564; 5,948,215 and 5,800,688, and PCT application PCT/US00/31756 and U.S. application Ser. No. 09/896,890, based at least in part thereon, all hereby expressly incorporated by reference herein. Processing machines of other configurations and other and ionized physical vapor deposition processes may also be used. With ionized physical vapor deposition used with the present invention, a fraction of atoms of coating material is ionized to from 30% to over 90%.

One embodiment of the invention utilizes the unique advantages of the ionized PVD apparatus as described in more detail in connection with FIG. 1 of U.S. Pat. No. 6,287, 435 and PCT application PCT/US00/31756 referred to above. This apparatus is particularly well suited for the sequential deposition and etching process. The sequential deposition and etching process can be applied to a substrate in the same process chamber without breaking vacuum or moving the wafer from chamber to chamber. The configuration of the apparatus allows rapid change from ionized PVD deposition mode to etching mode or from etching mode to ionized PVD deposition mode. The configuration of the apparatus also allows for instantaneous optimization of ionized PVD deposition process control parameters during deposition mode and etching process control parameters during etching mode. The consequence of these advantages is a high throughput of wafers with superior via metallization and subsequent electroplated fill operation.

Operating a processing apparatus to perform deposition during one portion of a cycle and to perform etching in another portion of a cycle involves controlling the operating and process parameters differently during deposition and etch modes. In accordance with embodiments of the present invention, one or more parameters are changed to switch between deposition and etching. Electrical power is, in most cases, the main parameter to differently control to affect a switching between a deposition mode and an etching mode. Electrical power affects ion flux as well as ion energy, both of which can be instrumental in achieving a net accumulation of material on areas of interest on a substrate, i.e. deposition, or a net removal of material from the areas of interest on the substrate, i.e. etching.

In accordance with some embodiments of the present invention, the pressure in a processing chamber of the apparatus in which the process is performed on a substrate is changed between two levels in switching between a deposition portion and an etching portion of a cycle. Usually, the pressure is higher during deposition and lower during etching. Conventional methods of controlling pressure, such as controlling vacuum pumps, valves or inlet gas flow, for example, may be used in switching between deposition and etching.

In accordance with certain embodiments of the present invention, the position of the substrate with respect to the coating material source, the plasma source, or a processing space occupied by a high density plasma, is changed in switching between a deposition portion and an etching portion of a cycle. More often the position of the substrate relative to such source is greater for deposition than for etching.

In accordance with other embodiments of the present invention, deposition and etch processes are performed in sequence with at least the etch process portion of the cycle being performed, with little or no static cathode magnetic field from the coating material source extending beyond the surface of the target, into the plasma in the vicinity of the wafer, or into the process volume between the target and the substrate that is occupied by the plasma.

In accordance with these embodiments of the invention, at least the etch portions of an ionized physical vapor deposition cycle are performed with a static magnetic field below a field strength level that adversely affects etch uniformity. The etch uniformity can be adversely affected by magnetic fields that render plasma non-uniform, for example, by causing the plasma to bunch-up at the center of the process volume. Solutions can be placed in three general categories, according to the invention. One category includes maintaining static magnetic field strength low during deposition and etching, in which case the field may be constant. The low level should keep the static magnetic field strength below about 30 Gauss. Levels in the 20-30 Gauss range are effective, with levels of 10-15 Gauss being more effective. Levels below 10 Gauss are preferable during etching, with 0 Gauss usually being most suitable. Low static magnetic fields are usable during both deposition and etching where a plasma energy source, such as an RF ICP source, provide enough sputtering plasma to sputter a target in absence of a magnetron, or where applications do not require a high deposition rate or high target erosion uniformity or utilization. A second category includes cases where a magnetron cathode is provided with a static cathode magnet producing 150 or 200 or more Gauss at the target surface, but where additional magnet elements or shunts are provided to block or otherwise maintain the static magnetic field strength in a process volume at a lower, for example below 30 Gauss, level. A third category involves providing lower magnetic field strength in the process volume during etching than during deposition, which is referred to as switching, alternating, or changing the static magnetic field strength between the two modes, deposition and etching. For example, reducing the flux at the target surface to 40 Gauss during etching produces marked improvement in etch performance.

In certain of such embodiments, static magnetic field shape in a process volume within the chamber is changed in switching between a deposition portion and an etching portion of a cycle. Permanent magnets, for example, are typically preferred behind a sputtering target to generate coating material for physical vapor deposition. Field lines from the magnets extend into the process volume. In accordance with these embodiments of the invention, these or other field lines present in the chamber for purposes of enhancing either the deposition or etch process are caused to change, when switching between deposition and etch modes, by controlling the magnet configuration or other parameters. Such magnet changes can include physically moving the magnet or any component thereof, for example, toward or away from the substrate, or toward or away from other parts of the coating material source, or by rotating or otherwise reorienting the magnet or magnet component. In the alternative, or in addition, an electromagnet or electromagnet component may be used in which the current is switched or otherwise varied when switching between deposition and etch modes. In most cases it may be preferable to employ stronger static magnetic fields reaching into the chamber during deposition, particularly sputter deposition, than during etching.

As an alternative to changing the static magnetic field between deposition and etching, deposition can be carried out with a weak strength or with no cathode magnet assembly, providing that no static magnetic field or that a low-strength static magnetic field extends into the process volume. As such, no static magnetic field of any significant strength extends sufficiently into the process volume to adversely affect the etching uniformity across the surface of the wafer.

In accordance with other embodiments of the present invention, maintaining higher density plasma conditions during deposition and lower density plasma conditions during etching is particularly advantageous, as explained more fully below.

Any one or more of the above control techniques may be used to facilitate sequential deposition and etching in situ in accordance with principles of the present invention.

The ionized physical vapor deposition (iPVD) apparatus described in U.S. Pat. Nos. 6,287,435; 6,080,287; 6,197,165 and 6,132,564 has many advantages. Still, constraints exist in utilizing such systems for advanced in-situ sequential deposition—etch processes. For example, the static magnetic fields produced by magnet packs behind the targets generate peripheral confinement of the plasma, enhancing a domed plasma density profile and reducing process yield. During typical physical vapor deposition, increased magnet field strength of the permanent magnet arrangement near the cathode is used to increase electron confinement, thereby increasing localized ions and sputtering rate. However, when a high density plasma is available, such as the ICP in these iPVD devices, the need to use a cathode magnet to trap electrons around the cathode to generate gas ions is less important. As a result, a satisfactory sputtering rate of material from the cathode is less dependent on the presence of a local static magnetic field. In fact, it has been found that a static cathode magnetic field can, in some cases, prevent ions produced by the high density ICP to participate in sputtering the target. With a sufficiently high density ICP, reduction of the static cathode magnetic field according to the present invention, can increase the sputtering rate. Consequently, the main reason for using a local static magnetic field in iPVD is a desire to maintain a predetermined cathode erosion pattern.

On the other hand, enhancing etching rate in typical plasma etching can be achieved with an increase in plasma density coupled with an increase of bias voltage. The effects of the static magnetic fields produced by the portion of the apparatus responsible for sputtering negatively interacts with the portion of the apparatus responsible for etching by confining the electrons produced by the inductively coupled plasma and thus centralizing the resulting plasma profile. The present invention achieves a balance between the two systems, deposition and etching, to effectively produce a sequential deposition and etch apparatus that produces a uniform film on the substrate and uniform feature coverage.

The invention provides the capability of performing deposition and etching effectively at relatively low substrate temperatures, for example, at 200 degrees C. and below. Further, embodiments of the invention, in addition to teaching low substrate temperature, proposes high DC target power, for example 8 kW to 19 kW, typically 11 kW. The high power levels not only result in a high throughput process but also optimize the ionization and ionized deposition of the metallic species, such as Cu or Ta.

The invention solves problems of the prior art by providing the sequential etch and deposition steps in situ in the same chamber with high throughput and without interfacial layers that may develop.

The configuration of the process module provided by the present invention accommodates a wide range of pressures to result in conformal via and trench coverage at high wafer throughput levels. The invention does not have the low pressure limitations of the prior art, and provides process pressure levels optimized for sputtering and etching steps of the process utilizing capabilities of the apparatus. Furthermore, the prior art does not teach a deposition-etch cycle with optimized source-to-substrate distance for each step to increase the uniformity of the resulting films.

When used in an iPVD sequential deposition-etch application, the present invention provides the advantages of generating metal vapor in the iPVD source without effecting negatively overall ICP source performance. The invention also makes possible increased metal ionization without additional increase of ICP source power. The invention also makes possible the avoidance of interaction of a static magnetic field of the coating material source and RF fields of the ICP source.

These and other objects and advantages of the present invention will be more readily apparent from the following detailed description of illustrated embodiments of the invention.

DETAILED DESCRIPTION OF THE ILLUSTRATED EMBODIMENTS OF THE INVENTION

Figure 1:
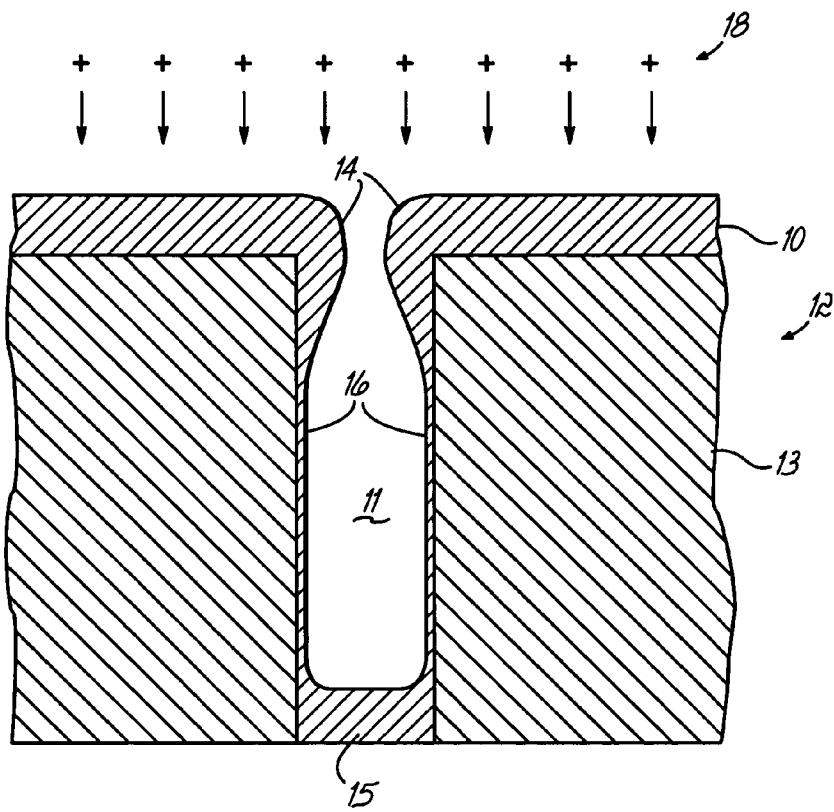
FIG. 1 is a diagram of the cross-section of a portion of a semiconductor wafer showing the mechanism involved in metal deposition by iPVD.

FIG. 1 depicts the deposition of a metal film 10 into via structure 11 formed in a dielectric interlayer 13 of a semiconductor wafer 12 by iPVD. As metal ions 18 are deposited onto the wafer 12, the metal deposition has a propensity to become thicker at the via entrance causing an overhang structure 14. Similarly, the deposition of metal at the bottom 15 of the via 11 becomes thicker than at the sidewalls 16. As via dimensions decrease to below 0.15 micrometers with no corresponding reduction in the thickness of the dielectric interlayer 13, the aspect ratio of the via 11 will have increased significantly, limiting the flux of metal ions 14 onto the sidewalls 16 of the via 11. For thin deposits of less than 100 Å, the film deposited on the sidewalls 16 of the via 11, especially for a seed layer of a metal such as copper, tends to have an agglomerated island structure. Gaps and discontinuities in a copper seed layer can lead to plating voids on the sidewalls 16, particularly at the bottom of a sidewall, where the metal coverage is the least.

Figure 2:
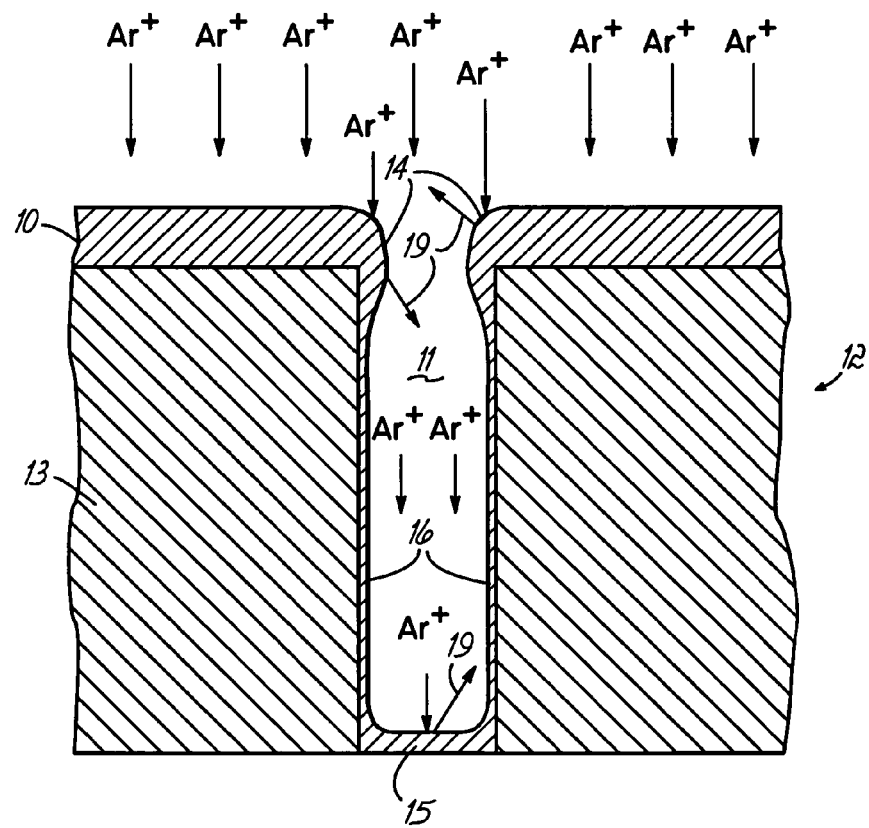
FIG. 2 is a diagram of the cross-section of the portion of a semiconductor wafer of FIG. 1 showing the mechanism involved in the resputtering by etching of the deposited metal.

FIG. 2 diagrammatically illustrates an etch cycle to resputter the metal deposition 10 from the bottom 16 of the via 11 and from the overhang structure 14 at the top of the via 11. In an etch cycle, argon ions (Ar+) strike and sputter material from the deposited layer 10 as indicated by the arrows 19. This sputtering removes excess material from the via bottom 16 and from the overhangs 14. When the metal layer is copper, the etch process increases the continuity of the Cu on the bottom 16 and top portions of the sidewall 16 by redeposition of Cu sputtered from the via bottom 16 and from the overhang 14 at the via entrance. If the metal being etched is a barrier layer, the decrease in the thickness at the via bottom 16 reduces the overall contact resistance of the via and improves device performance.

The deposition and etch cycles are described with reference to the iPVD apparatus 20, illustrated in FIG. 3. For ionized PVD, a wafer 21 is held in place on top of a temperature-controlled electrostatic chuck 22. Sputtering gas is supplied from a source 23 into a vacuum processing chamber 30, the pressure of which is maintained at a vacuum by pump 29 and adjusted to a proper ionized deposition range for iPVD. DC power is supplied from a power source 24 to target 25, and RF power is supplied from an RF generator 27 of an ICP source 29 that includes an antenna 26. These electrical power sources 24 and 27 are turned on to power levels appropriate for the deposition by iPVD. The RF power produces a high-density inductively-coupled plasma in a process volume 29 between the target 25 and the wafer 21. The process volume 29, as it relates to a particular process step, is that portion of the inside of the process chamber 30 that contains the plasma that has an effect on the process step being performed in the chamber 30.

Wafer RF bias is supplied to the chuck 22 by RF bias generator 28, which can also be turned on to a level appropriate during deposition to provide a net negative bias on the wafer 21 to improve and affect the process. The antenna 26 is positioned outside of the chamber 30 behind a dielectric window 31 in the chamber wall 32. A louvered deposition baffle 33, preferably formed of a slotted metallic material, is located inside of the chamber 30 closely spaced from the window 31 to shield the window 31 from deposition. A magnet pack 34 is located behind the target 25 to produce a magnetic tunnel over the target 25 for magnetron sputtering. A magnet control 37 is provided to change the magnet field strength between deposition and etch modes. This can include a magnet lift or rotation mechanism for permanent magnets when they are included in the magnet pack or a magnet current control for electromagnets when they are included in the magnet pack.

The temperature of the wafer 21 is controlled to obtain the best via metallization. The wafer table 22 is equipped with a Z-motion drive 35 to adjust the substrate-to-source distance to provide the best deposition uniformity, and the best coverage and symmetry of the sidewall 16 and bottom 15 of the via 11. Some typical ionized PVD deposition parameters are given in Table I.

TABLE I

Typical Ionized PVD Deposition Parameters

| Material | DC Power (kW) | ICP Power (kW) | RF Wafer Bias Power (W) | Pressure (mT) | $N_2$ Flow (% of Total Flow) | Wafer Table Temp (° C.) |
|---|---|---|---|---|---|---|
| Ta | 8-19 | 1-7 | 0-200 | 50-120 | — | 25-100 |
| $TaN_x$ | 8-19 | 1-7 | 0-200 | 50-120 | 3-50 | 25-100 |
| Cu | 8-19 | 1-7 | 0-100 | 50-100 | — | −50-0 |

For the processes represented by Table I, the substrate-to-source distance can typically be 150 to 275 mm. Argon gas is the typical sputtering gas. To deposit a barrier layer of a metal nitride such as $TaN_x$, nitrogen gas, in addition to Argon gas, is used during sputter deposition.

After a certain desired amount of deposition, the DC power 24 to the target 25 is reduced or turned off to substantially reduce or stop the deposition process. Those skilled in this art will realize that the deposition process can be substantially reduced and/or stopped by reducing the DC power level 24 to a very low level without completely turning it off. The RF excitation to the ICP antenna is kept on to continue to generate an Argon plasma. At this point, chamber Ar pressure, ICP power, RF substrate bias power and substrate-to-source distance is adjusted to provide optimum etch conditions. If the previous deposition step was for a metal nitride, nitrogen flow to the chamber may be turned off or reduced. The temperature of the wafer table 22 can also be modified for the etch step, but this is usually not necessary. Typical etch conditions are given in Table II.

TABLE II

Typical Etch Process Parameters for Metals and Metal Nitrides

| ICP Power (W) | RF Wafer Bias Power (W) | Pressure (mT) |
| --- | --- | --- |
| 50-3000 | 100-1000 | 0.1-2 mT |

In processes of the prior art, agglomeration of a seed metal layer is common, which results in voids occurring in an electroplated fill that is deposited over the seed layer, which leads to unacceptable product with reliability problems.

In accordance with the present invention, wafer temperature is controlled during both the sequential deposition and etch steps. These processes may be achieved in the apparatus described in U.S. Pat. No. 6,287,435 by providing the electrostatic chuck 22 with cooling fluid passages and the appropriate temperature controls. Good thermal contact between the chuck 22 and the wafer 21 can be achieved by providing backside gas conduction between the wafer 21 and the chuck 22. Backside gas pressure can be controlled during both deposition and etch steps to insure that thin metal deposition, especially at the sidewalls of the via structures, are not agglomerated.

During the etch step, especially for copper deposition-etching process, the copper film is kept cold and not allowed to heat up during the etching step where energetic ions bombard the substrate under the influence of relatively high substrate bias. The purpose of the etch step is to reduce the amount of overhang which is detrimental to a successful via or trench fill and to reduce the thickness of the bottom coverage. It is also the objective of the etch step to redeposit more material to the sidewalls of the vias and trenches to make the film there more continuous. If the temperature of the substrate 21 is not controlled and is allowed to increase during the etch step, the mobility of the copper atoms increases and they diffuse on the surface of the substrate 21 and result in agglomeration of large copper nodules at the sidewalls 16 of the vias and trenches 11 instead of forming a continuous copper film. Therefore, the substrate temperature is controlled and kept cold during the etch step.

For example, during etch, the power to the substrate table 22 from the bias power generator 28 is maintained at about 500 watts, which results in about −300 volts bias on the wafer table 22. Heat generated at the substrate 21 during such etch step is extracted efficiently by the wafer chuck 22 to keep the temperature of the wafer 21 at substantially below room temperature, preferably below 0°, preferably to about −30° Celsius.

After the etching step, another deposition step may be administered. The cycle of deposition followed by etching may be repeated once or as many times as required. In another embodiment, at least one etch step may be employed during the entire process. Such etching process can, for example, occur between two deposition steps. In one embodiment of the process of the invention, a typical barrier process may include a tantalum nitride deposition followed by an etch step followed further by a tantalum metal deposition followed by another etch step. Thickness of material deposited during the deposition step is larger as compared to the thickness removed during etching, resulting in net deposition.

Figure 4:
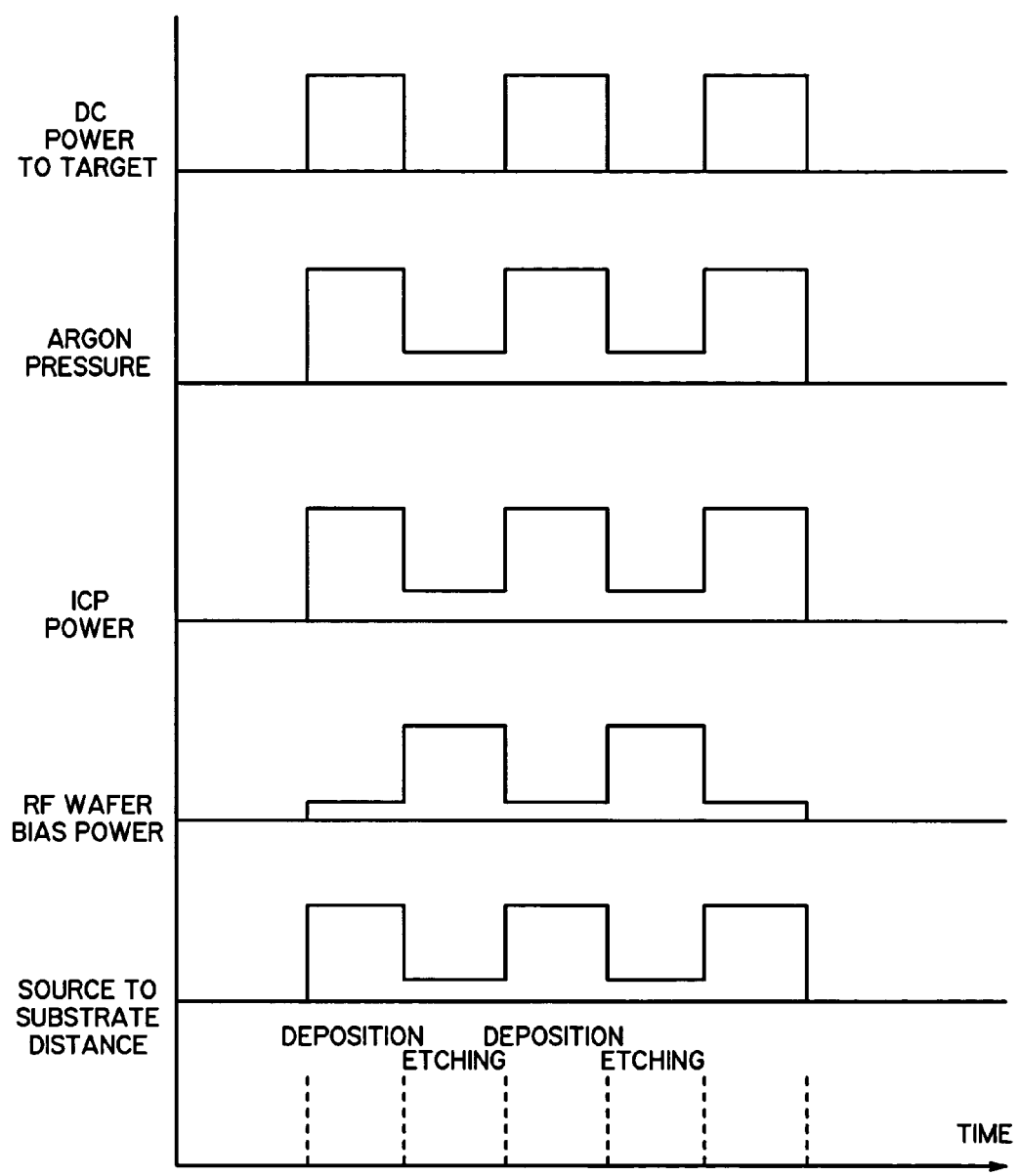
FIG. 4 is a graph illustrating the switching of parameters during a sequential deposition and etching process according to an embodiment of the present invention.

In one sequence of operation, each cycle may have fixed deposition and fixed etch parameters, such as fixed time, pressure, DC and RF power levels and source-to-substrate distances for each of the deposition and etch modes. An example of this sequence of operation is depicted in FIG. 4, where DC power from the power source 24 to the target 25 is switched on for deposition and off for etching. Argon gas vacuum pressure is switched between a higher pressure for deposition and a lower pressure for etching by control of the pump 29 and gas flow in 23. ICP power from the RF generator 27 to the antenna 26 is switched between a higher power level for deposition and a lower power level for etching. RF bias power from the generator 28 to the table 22 is switched from a lower bias for deposition and a higher bias for etching. The Z-drive 35 moves the table 22 to bring the wafer closer to the source (which includes the target 25 and the antenna 26) for etching than for deposition.

Figure 5:
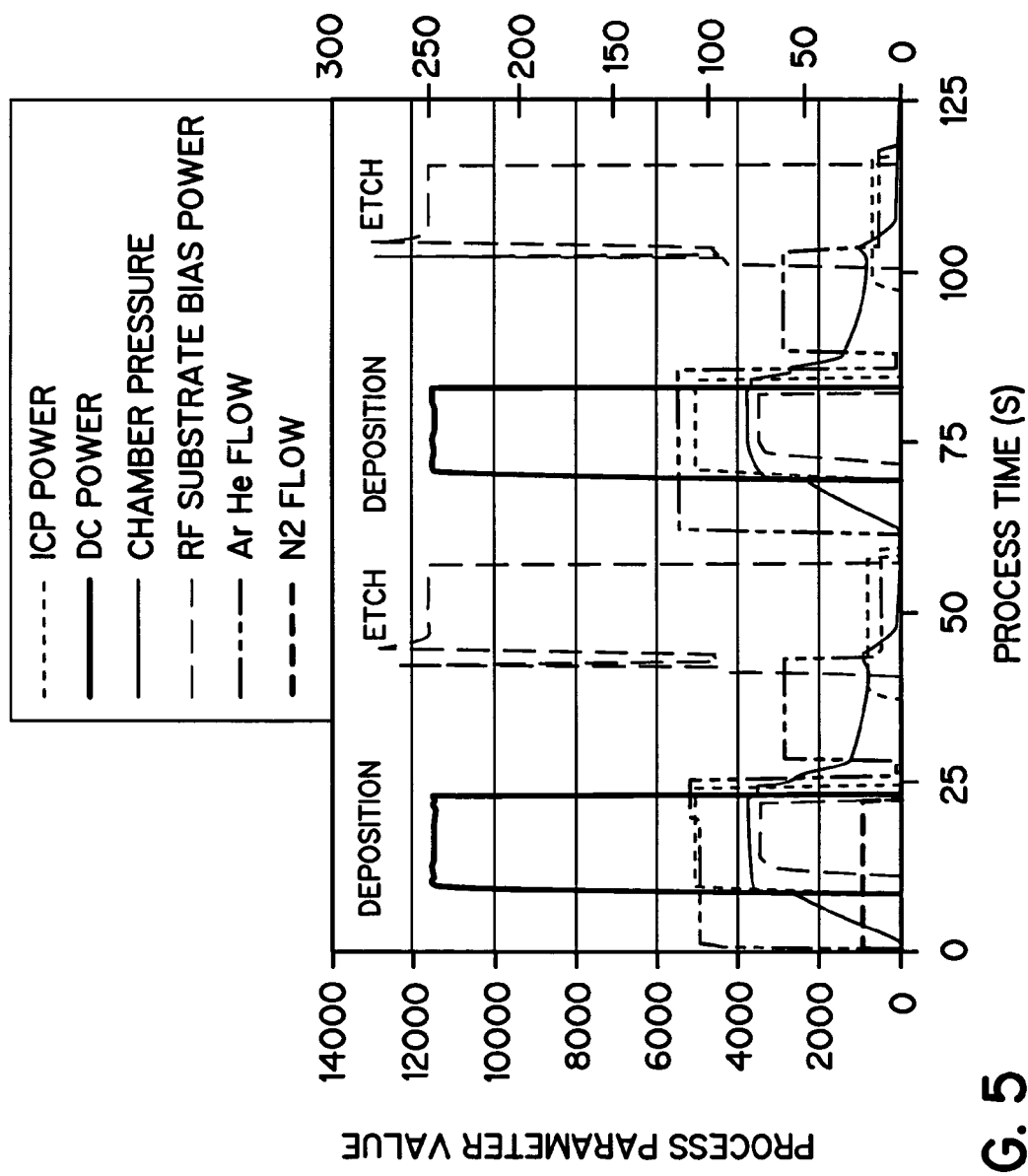
FIG. 5 is a graph illustrating the variation of parameters during a sequential deposition and etching process according to another embodiment of the present invention.

In another sequence of operation of the system performing a process of the invention, relative portions of deposition and etch modes, and their respective process parameters, may be varied from cycle to cycle to affect the best overall final result. An example of this sequence is represented by FIG. 5, on which various curves are superimposed to better show their time relationships. The advantage of the system performing this embodiment of the process is that it allows fast change from deposition mode to etching mode. The ability of the apparatus to provide both a uniform deposition at high pressures, which has its own advantages, and a uniform etch at low pressure, facilitates the achieving of the required results with high throughput. The iPVD source of the apparatus set forth in U.S. Pat. No. 6,287,435 and PCT application PCT/US00/31756 exhibits uniform or highly directional metal flux to the wafer. Such a source includes a frusto-conical target or annular ring-shaped target with an RF coil behind a dielectric window at the center of the target. With such a source, under certain circumstances, the flux of positive argon ions onto the wafer may be non-uniform, and rather centrally peaked, exhibiting a broad angular distribution around lines normal to the substrate. This may be suitable for higher pressure deposition. But re-sputtering during an etch portion of a cycle of material deposited during the deposition portion of the cycle would be more pronounced at the center than at the edge of the wafer, which may be undesirable for the etching that is to be carried out. Lowering the pressure during the sputter etch step causes the flux of positive argon ions onto the wafer to become more uniform and with the help of wafer bias, more directional and perpendicular to the substrate. The Z-distance adjustment to control the plasma source-to-wafer spacing can be made to provide the best etch and deposition uniformity.

Lowering the pressure during the etch step achieves another benefit. At higher pressures, such as are typically used during the deposition portions of the cycle with the iPVD source discussed above, material ejected into the plasma from the wafer undergoes multiple collisions and may be reflected back onto the wafer being ionized. This flux of thermalized material can increase the overhang. This overhang is reduced by the deposition-etch iPVD process, because at the lower pressures, the mean free path of material sputtered from the wafer is longer, and it is much less likely to be reflected back onto the wafer before it is either ionized or impacts walls 31 of the chamber 30. Ideally, the deposition-etch cycle should be rapid, so as to allow large numbers of cycles in a typical process time of 60 sec. A pulsed DC power supply with variable duty cycle would be ideally suited for this purpose. Substrate-to-source spacing is similar to that in FIG. 4.

Figure 5A:
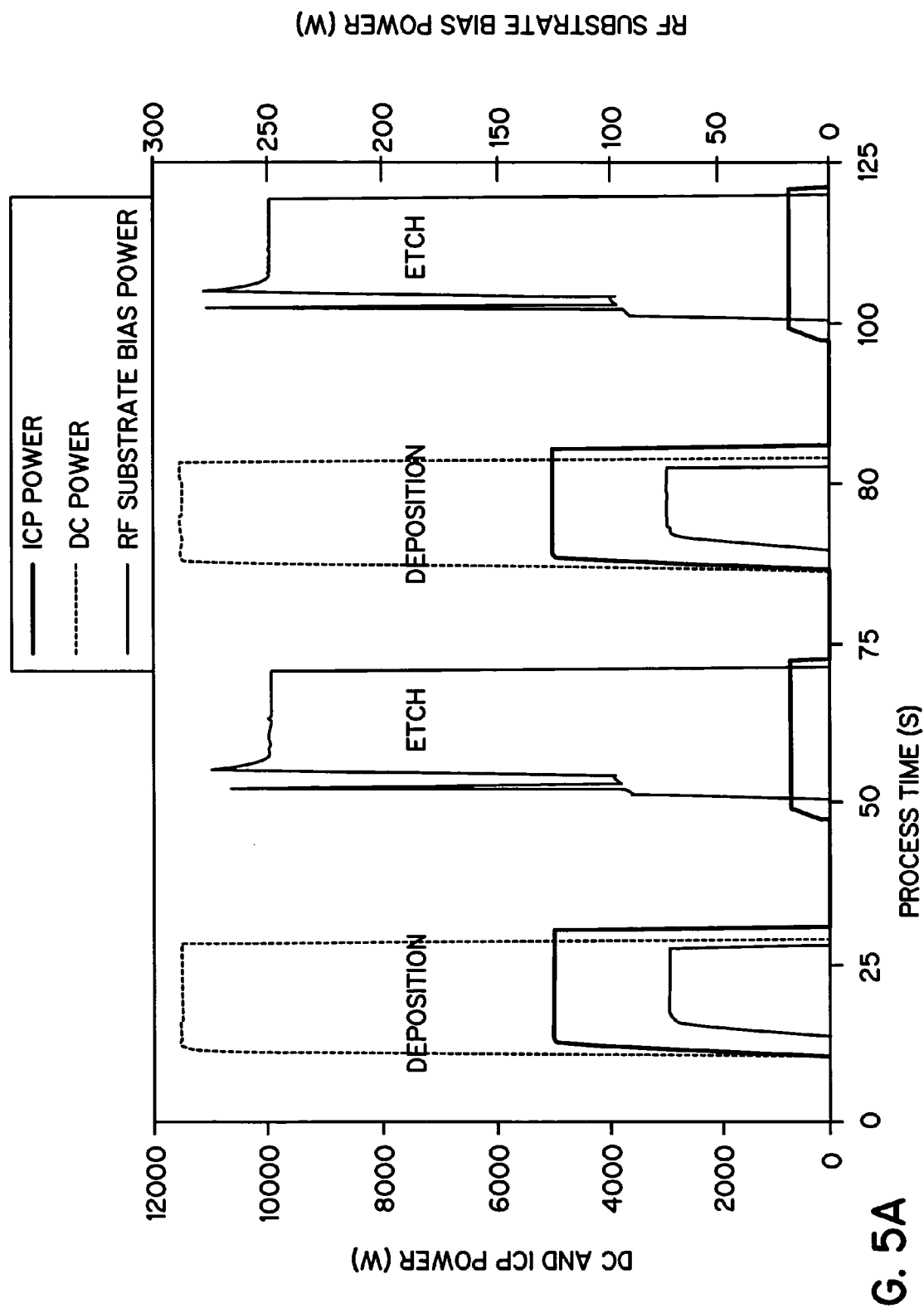
FIGS. 5A and 5B are graphs illustrating selected portions of the graph of FIG. 5 in more detail.
Figure 5B:
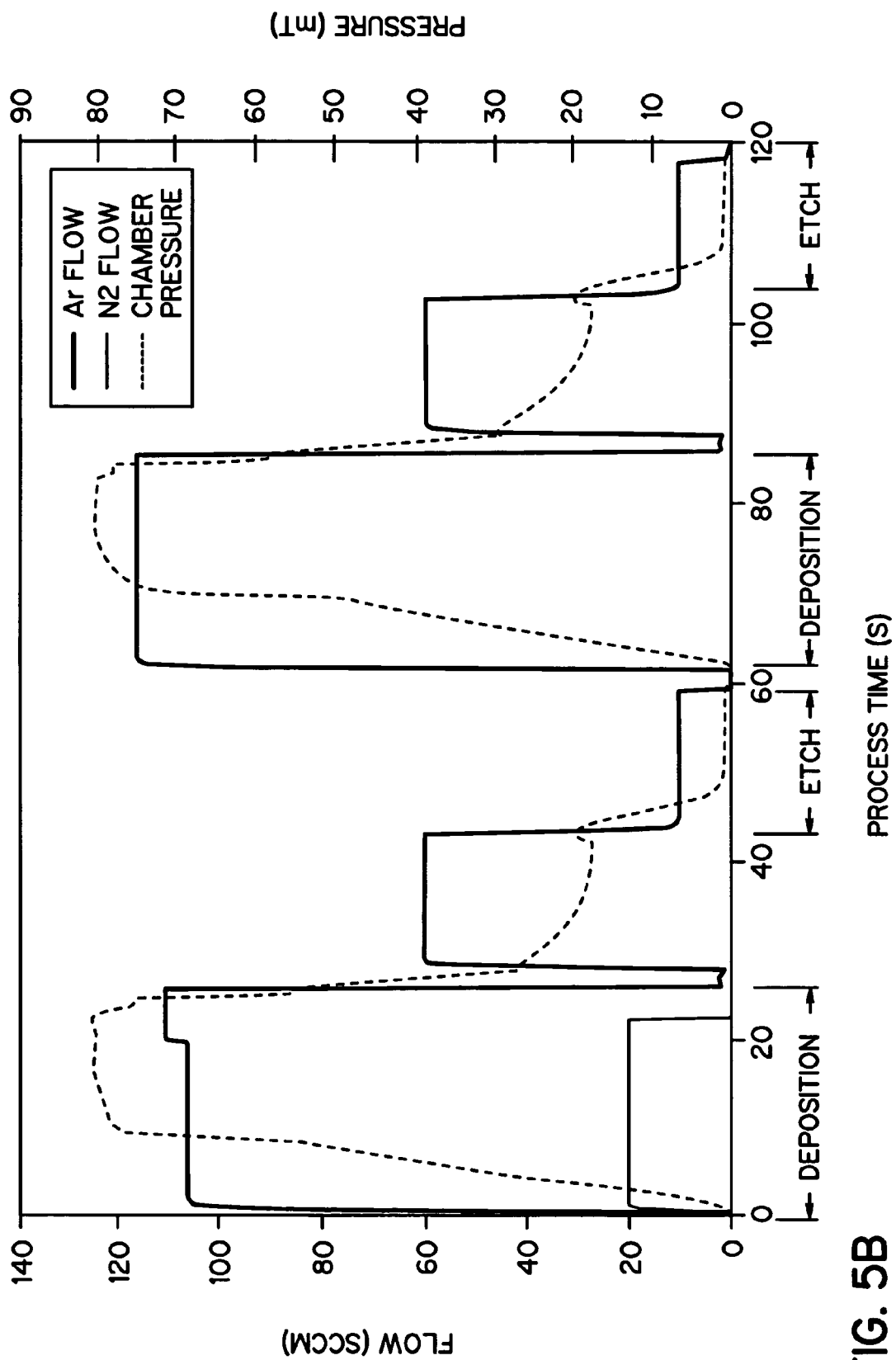

In FIG. 5, "ICP Power" refers to the RF inductively coupled power from generator 27 for forming the dense plasma, while "RF Substrate Bias Power" refers to the RF power applied to the table 22 from the generator 28 to create a negative bias on the substrate 21. "DC Power" refers to DC power applied from the power supply or source 24 to the target 25 material to cause material to sputter. The parameters may be controlled so that the plasma, ignited during the higher pressure deposition step, is sustained continuously throughout the etch step. FIG. 5 illustrates actual data of the operation of a system in which this is not the case, and in which argon flow is increased prior to the etch step to reignite the plasma. The re-ignition of the plasma is responsible for the apparent spike in the RF substrate bias power in FIG. 5. FIGS. 5A and 5B are provided to separate the parameter plots of FIG. 5 for clarity.

Figure 6:
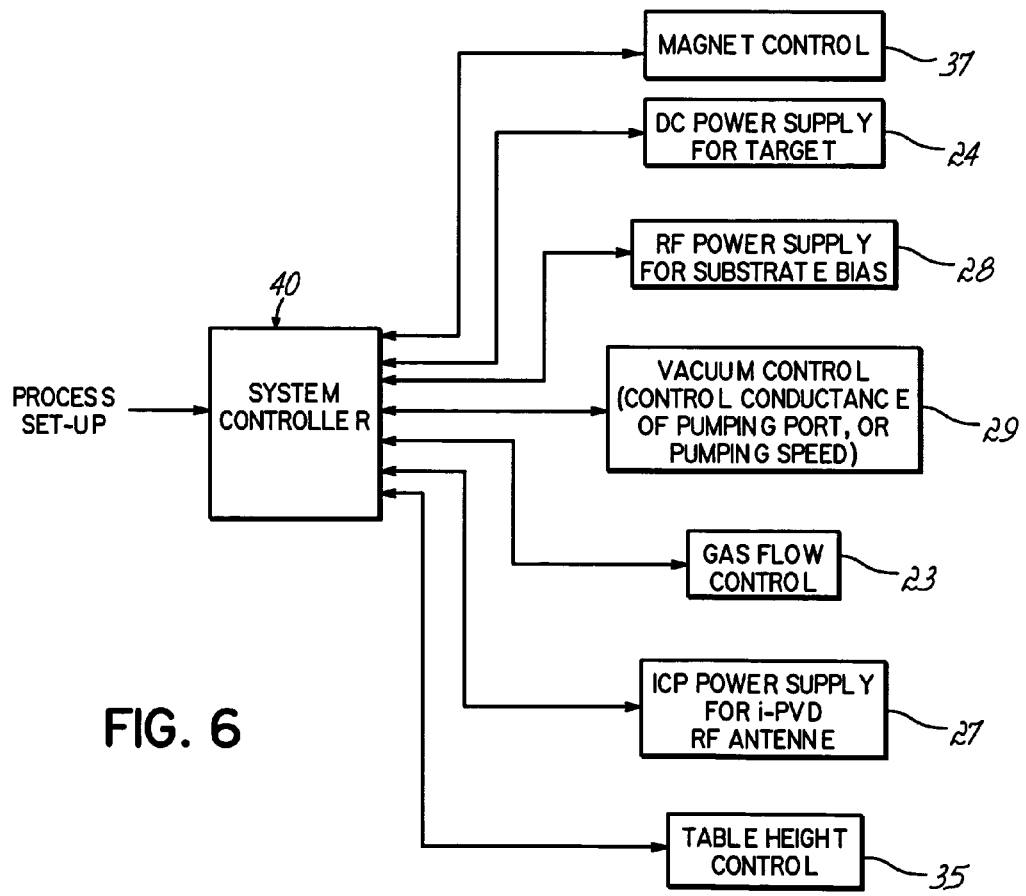
FIG. 6 is a diagram illustrating a portion of a control system for the apparatus of FIG. 3, 3A or 3B.

A system controller 40 is programmed to achieve the parameter control depicted in FIGS. 4 and 5, and is set forth in the diagram of FIG. 6.

The process of the invention is particularly advantageous when used with apparatus 20 referred to above, which deposits materials, particularly metal, over a wide pressure range, which includes deposition pressures in the range of 1-150 mTorr or higher, and is particularly useful where pressures are over 30 mTorr, particularly in the range of from 50-150 mTorr, or at such other pressures at which sputtered material undergoes a large number of collisions, or is "thermalized", between the target and the substrate.

The apparatus 20 also has the advantage of being able to deposit over a wide RF table power range, allowing deposition at very high table powers. Low table power processing combined with an etch can only remove part of the overhang before all the sidewall and bottom material (at least for the barrier layer) is removed as well. A high table power deposition process results in high bottom coverage and thick deposition on the bottom sidewall as well as better sidewall coverage on the rest of the via, thereby allowing the etch step to run until the overhang is more completely removed. These benefits occur as a result of developing a sufficiently high DC bias on the wafer 21 that simultaneously re-sputters while depositing as well as affecting the trajectories of the ions in a direction more perpendicular to the wafer 21. This enhances coverage at the feature bottom 15 and allows for more etching of the overhang before the material at the feature bottom is removed. With the ability to optimize table power and deposition pressure, the increase of the overhang during the high table power deposition from redeposition of resputtered material can be minimized, allowing for an overall reduction of the overhang by the etch processes.

The deposition/etch cycles are preferably carried out by rapid and repeated switching between high deposition pressures and lower etch pressures of less than 10 mTorr, particularly of from a few mTorr down to 0.1 mTorr or lower. The pressure switching is carried out while switching sputtering power on the target and switching of bias power on the substrate between levels. The substrate bias can be shifted or switched by the pulsing of RF power on the substrate. Optionally, the substrate bias can be switched between two levels of RF power. The substrate bias switching produces a negative potential on the substrate relative to the plasma of tens of volts during deposition and of hundreds of volts during etching, while the target DC bias switches between a negative target sputtering voltage during deposition and zero or near zero volts during etching. Bias power during etching is preferably an order of magnitude or more than during deposition.

The switching is preferably in cycles of about one second per cycle, or in the range of 0.1 to 20 seconds per cycle, with the total processing time per wafer being preferably in the range of one minute or less, although with some processes longer processing times may occur.

According to other embodiments of the invention, the flux of positive argon ions onto the wafer during the etch portion of the cycle is made uniform in absence of metal flux from the iPVD source during the deposition portion of the cycle. This is achieved by surrounding the chamber described above with another solenoidal coil 41, which can be located either internal to the chamber 30, as illustrated in FIG. 3A, or external to the plasma. With such a coil 41, the positive argon ion flux can be made more uniformly distributed above the substrate 21. This dual coil system that includes coil 41 and the antenna 26 can be pulsed in such a way as to deposit as little as several mono-layers onto the surface of the substrate during deposition, and then interrupt deposition so as to have the effect of sputtering material from the top corners 14 of the feature 11 and the bottom 15 of the feature 11 where relatively large amounts of material are deposited, onto the sidewalls 16 where little material is deposited but where coverage is most critical (see FIG. 1).

Figure 3:
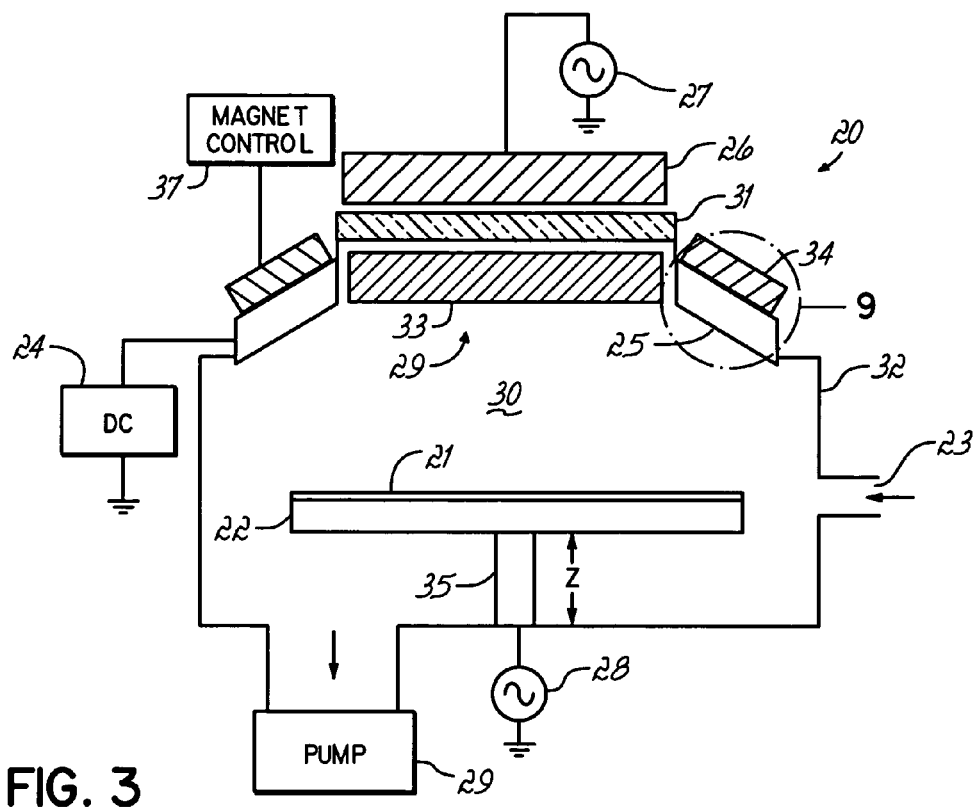
FIG. 3 is a diagram of the cross-section of one embodiment of an iPVD apparatus for use with the present invention.
Figure 3A:
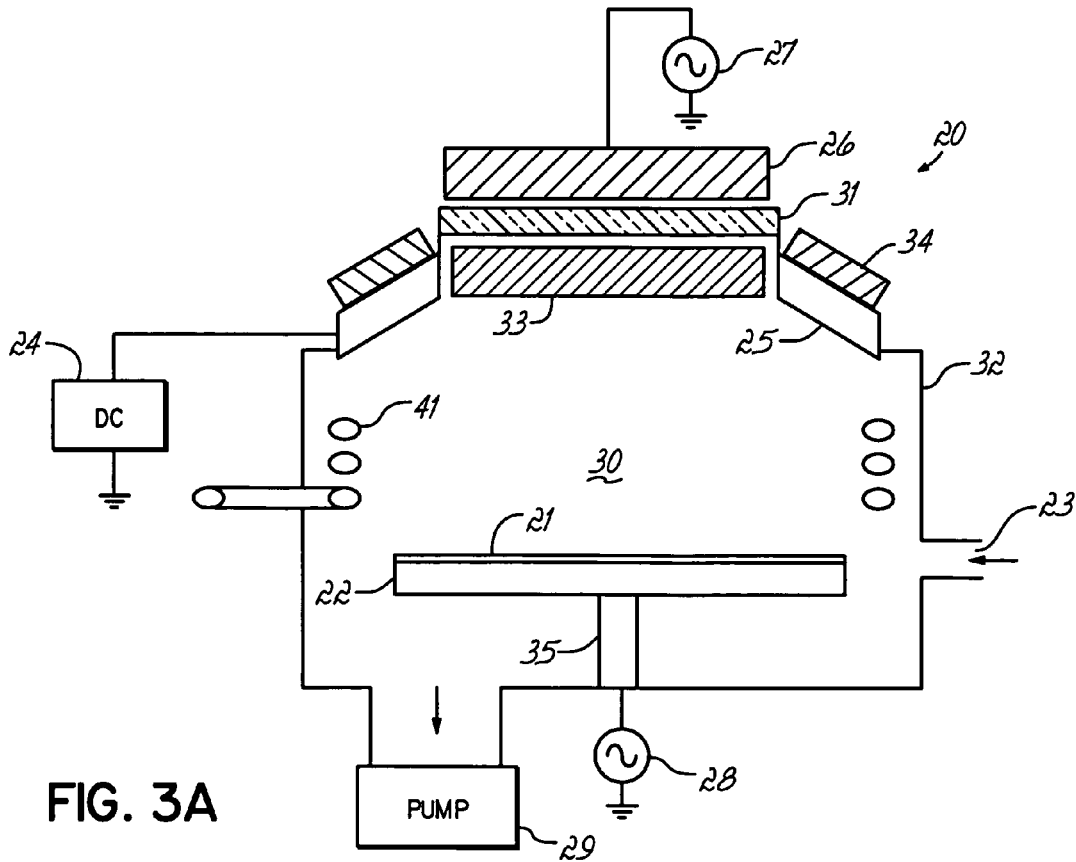
FIG. 3A is a diagram similar to FIG. 3 of the cross-section of another embodiment of an iPVD apparatus for use with the present invention.
Figure 3B:
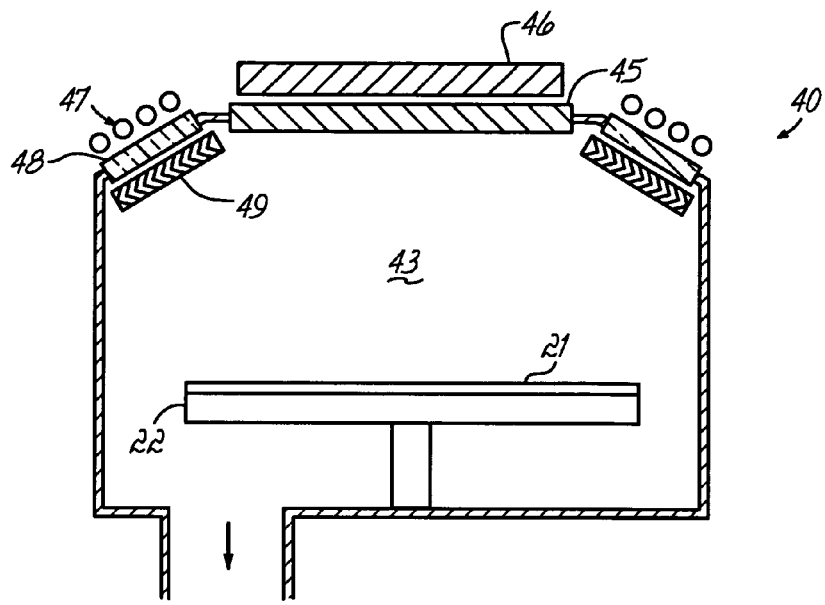
FIG. 3B is a diagram similar to FIGS. 3 and 3A of the cross-section of still another embodiment of an iPVD apparatus for use with the present invention.

Another alternative configuration 40 includes a conical ICP source 44 with a traditional planar magnetron at the center thereof that includes a target 45 behind which is a magnet assembly 46, as depicted in FIG. 3B. The source 44 includes a conical coil 47 outside of a chamber 43 behind a dielectric window 48 in the chamber wall 42, with a conical deposition baffle 49 protecting the window 48 from deposition.

The configurations described above may be run at higher pressure when depositing metal than when etching. For this eventuality, a rapid wave of pumping out the chamber may be provided. This may utilize the pumping scheme shown in FIG. 7.

Figure 7:
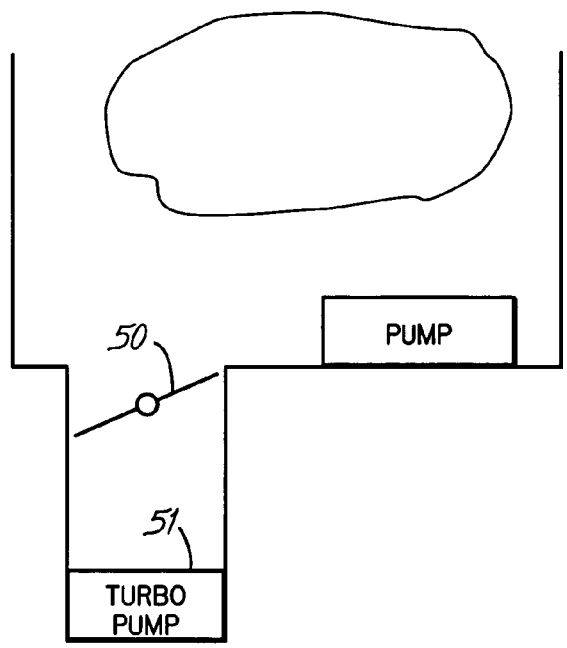
FIGS. 7 and 7A are diagrams illustrating portions of alternative gas flow control systems for the apparatus of FIG. 3, 3A or 3B.
Figure 7A:
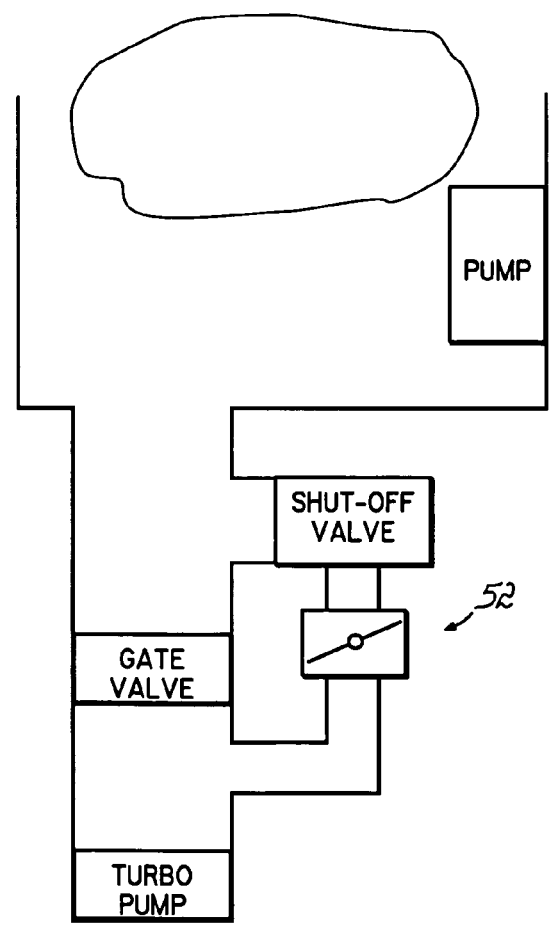

Chambers such as illustrated in FIGS. 3, 3A and 3B may be equipped with a throttling gate valve 50 and turbo pump, as illustrating in FIG. 7. For cases where such a throttling gate valve 50 does not have the ability to control the range of conductances desired, the pumping configuration of FIG. 7A may be used with a parallel branch 52 employed to increase the range of conductance.

The pressure difference between sputter deposition and etching can also be achieved by varying the gas flow rate into the sputtering chamber. A combination of gas flow change and pumping speed change may also be utilized.

The gas may be argon, which is often preferred, but may also be any other inert gas or may be a non-inert gas that is compatible with the process.

Sputtered material can be Copper, Ta, or any other metal, a dielectric material, which will need further RF power supply for the electrically non-conductive target, or a semiconductor material.

Resputtering of thick deposits of barrier layer materials such as tantalum, TaN, TiN and titanium from the bottoms of features is useful in avoiding high contact resistances, which such thick deposits of such materials at the bottoms of the features causes.

With conductor materials such as copper that are deposited over the barrier layer materials, resputtering of the material from the edges avoids the shading of the insides of the features, which such overhanging material causes, which inhibits effective bottom-up filling of the feature in a subsequent plating process.

The directionality of the argon ions during the etching can be controlled so as to facilitate resputtering from the edges of the features onto the sidewalls at the upper half or portion of the feature and resputtering from the bottom of the feature onto the sidewalls at the lower half or portion of the feature.

The invention may also be used where the deposition process is a reactive process, for example, a process used to deposit compound films such as TiN, TaN, SiN, etc. In such cases, during deposition, $N_2$ or some other reactive gas is introduced into the chamber in addition to Ar gas.

RF power supply frequencies can be chosen for best system and process results. Typical frequencies might be 13.56 MHz or 2 MHz but are not limited to these frequencies.

In a typical iPVD apparatus of the type illustrated in FIG. 3, for example, the sputtering of the annular conical target 25 is enhanced, and its erosion profile is controlled, by annular magnet pack 34. The magnet pack 34 may, for example, consist of three rows of the rectangular magnets and a yoke configured in circular paths and oriented to generate a static magnetic field parallel to target surface. Such a magnet pack may produce, for example, a null-B point at a centerline of its annular body, close to the target-to-backplane boundary, as described in U.S. Pat. No. 6,458,252, hereby expressly incorporated herein by reference.

In certain preferred iPVD processes for the deposition of copper or tantalum, for example, as described in U.S. Pat. No. 6,287,435, metal vapor flux sputtered from the target 25 is thermalized at argon pressure which is higher than typical sputtering pressures, which are around 30 milliTorr. The axially positioned ICP source 29 produces high density plasma and effective ionization of the metal in central area of the processing chamber 30 and above the wafer 21. Metal ions diffuse towards the wafer surface and in dependence on bias power, and are more or less accelerated by a self-bias voltage within a plasma sheath, which is the potential difference between the potential of the plasma and the potential at the wafer surface.

During a typical ionized physical vapor deposition process, magnet field strength of the permanent magnet arrangement 34 near the target 25 is expected to increase electron confinement adjacent the target 25, thereby increasing localized ions and increasing the sputtering rate. When a high density plasma such as that produced by the ICP source 29 is available, the trapping of electrons trapped around the cathode by the magnet pack 34 is less important for the generating of gas ions. Therefore, the sputtering rate of material from the cathode is less dependent on the local static magnetic field, leaving a desirable cathode erosion pattern as the main reason for maintaining a local static magnetic field. During a typical plasma etch, the high plasma density produced by the ICP source 29 along with the bias voltage on the substrate determines the etching rate. When the two operations, iPVD and etching, are combined in one chamber, the effects of the static magnetic fields produced by the portion of the apparatus responsible for sputtering can negatively interact with the portion of the apparatus responsible for etching by confining the electrons produced by the inductively coupled plasma and thus centralizing the resulting plasma profile. Static magnetic fields can have a negative effect on ICP source uniformity due to peripheral plasma confinement, reducing diffusive radial loss. The following embodiments of the invention achieve a balance between the two systems and effectively produce a sequential deposition and etch apparatus that produces a uniform film on the substrate and uniform feature coverage.

In accordance with this embodiment, the configuration of the process module may accommodate either a reduced strength static magnetic field in vicinity of the target surface or with no static cathode magnetic field. A weak magnet configuration may maintain the static magnetic field shape and orientation of the stand-alone iPVD equipment, so that the field within the target and the nearby plasma generates an optimal erosion profile for high target utilization. Such low or reduced field strength can be maintained constant, throughout both the deposition and etch process, or may be maintained at a level most suitable for the deposition portion of the cycle and switched to a low or absent static magnetic field condition during the etch portion of the cycle.

Switching can be achieved by providing a magnet lift mechanism that bodily removes the entire magnet pack from its position during the deposition of the cycle to a point far away at least 30-60 mm, to 100 mm, from the target backplane during the etch portion of the cycle, so plasma confinement close to target surface is furthermore significantly diminished during the etch portion of the cycle. Alternatively, a kit may be provided to adapt an iPVD apparatus for use in performing a sequential deposition-etch process that moves the magnet to such far away point during the entire cycle.

Figure 8:
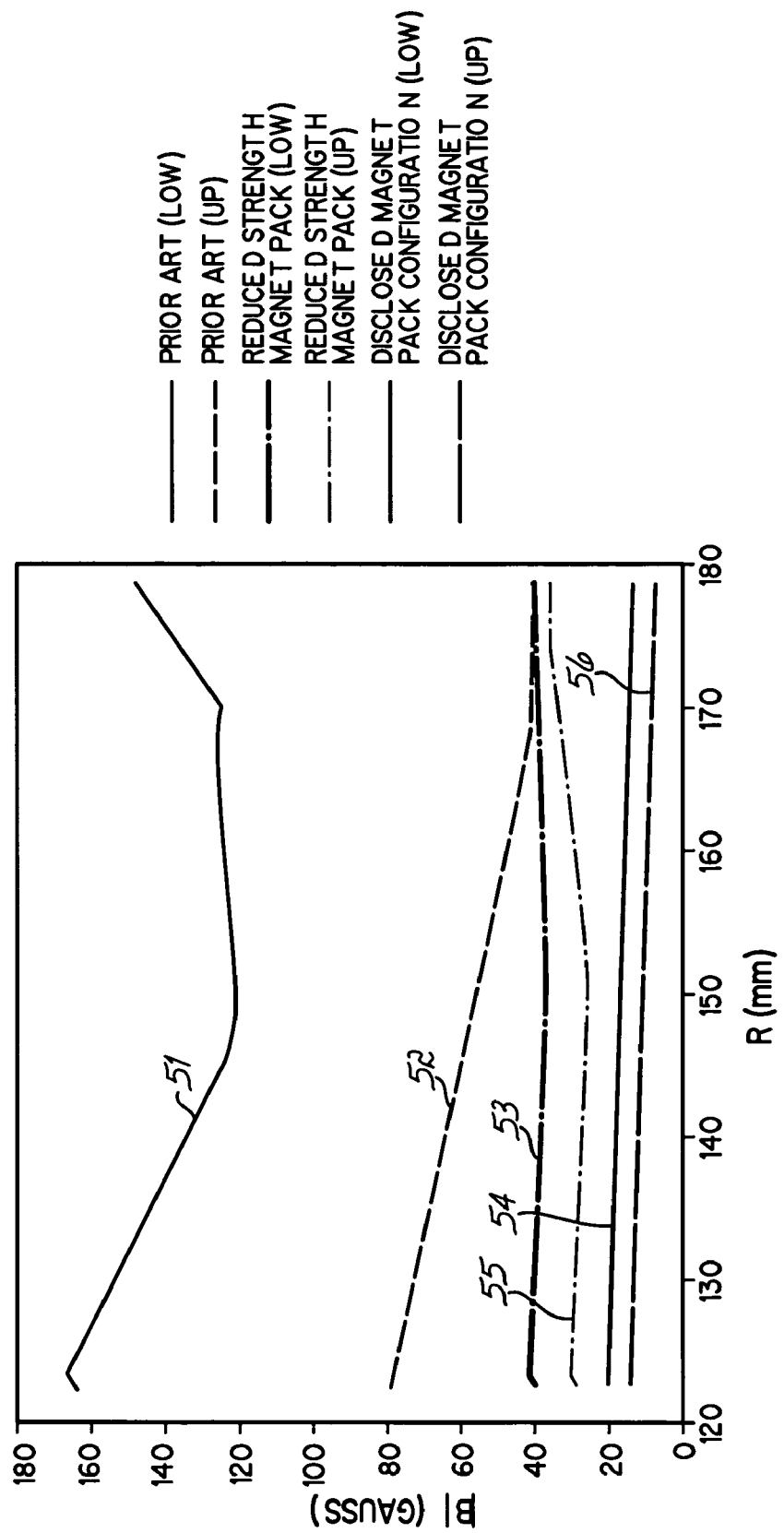
FIG. 8 is a graph of static magnetic field strengths across a target surface with various magnet configurations.

Magnet pack configurations for iPVD, as in U.S. Pat. No. 6,458,252, may typically produce static magnetic field strength at the target surface of over 150 Gauss or several hundred Gauss, using a magnet with magnetic retentivity of up to several thousand Gauss, for example, 5,000-6,000 Gauss, to provide confinement of the plasma and a desired erosion profile and high target utilization. A typical magnetic field strength profile 51 at the target surface, as a function of target radius, is illustrated in the graph of FIG. 8. The field strength of the curve 51 shows a magnitude within the range from 120 to 170 Gauss along the 123-184 mm radius of a given conical target.

In an annular target configuration of the type illustrated, the plasma density exhibits a dome profile due to radial diffusion loss distribution that has an impact on process uniformity at the wafer. Moreover, such configuration may be very sensitive to any ICP plasma azimuthal non-uniformity. Localized plasma non-uniformity is increased by plasma confinement in a static magnetic field at the target surface with a consequent erosion of the target surface. This has an impact on target lifetime and utilization as well as on deposition uniformity, particularly on a 300 mm diameter substrate wafer. Static magnetic field strength at target surface reduced to about 5-10 Gauss eliminates this confinement effect.

Distancing a standard iPVD magnet pack from target backplane reduces the magnitude of the static magnetic field at the target surface to 40 to 80 Gauss, as illustrated as curve 52 in FIG. 8. This distancing was achieved, for example, by lifting the magnet pack about 38 mm from its normal deposition position at the back of a downwardly facing conical target. Further distancing of the target eventually tends to interfere with, or tends to put additional restrictions on, other iPVD source hardware. Lower magnetic static fields than this are preferred to reduce non-linear plasma confinement effect on plasma density. Moreover, static magnetic field orientation and magnitude profile is affected in a negative way making low utilization erosion profile on the target.

Field strength may also be reduced by reducing magnetic strength of the magnets, but there is a minimum practical limit to doing this due to long-term stability and magnetic material properties. For example, replacing the magnets of the magnet pack described in U.S. Pat. Nos. 6,287,435 and 6,458,252 provides static magnetic field strength of about 35-40 Gauss with the magnet pack in its lower deposition position which drops to about 15-20 Gauss with the magnet pack raised, as illustrated as curves 53 and 54, respectively, in FIG. 8. Reducing the number of magnets in the azimuthal direction also reduces static magnetic field strength, but azimuthal uniformity of the strength of the static magnetic field has also significant impact on target lifetime and utilization and should be taken into account. Modification of the magnet size has limits along the radial direction tangential to target surface, because it may completely change the orientation of the static magnetic field, and thus the utilization of the target. All these considerations should be taken into the account when optimizing the magnet pack for particular processes. Examples of static magnetic field strengths with such reduced strength magnet packs are illustrated in FIG. 8, with curve 53 showing the strength for the magnet pack adjacent the target and curve 54 showing the magnet pack distanced from the target as in curve 52.

Figure 9:
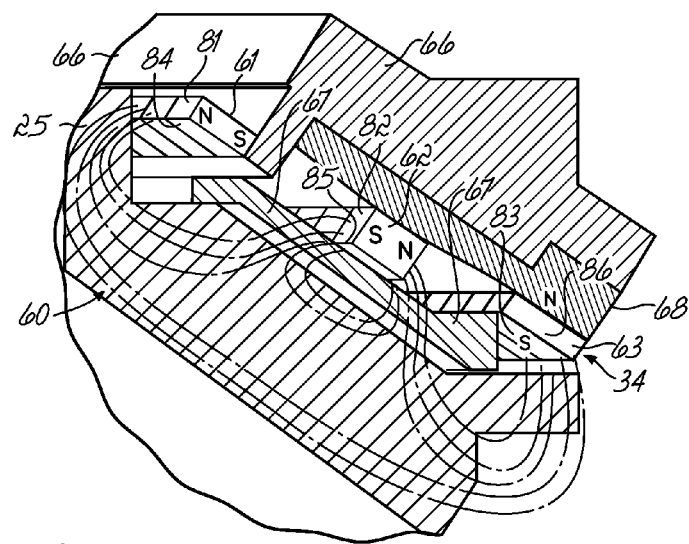
FIG. 9 is a cross-sectional diagram of a target magnet arrangement according to certain embodiments of the invention.

A magnet configuration 60 which can be used to provide a static magnetic field below 10 Gauss at target surface is illustrated in FIG. 9. Examples of static magnetic field strengths with such a magnet pack 60 are illustrated in FIG. 8, with curve 55 showing the strength for the magnet pack 60 adjacent the target and curve 56 showing the magnet pack 60 distanced from the target.

FIG. 9 illustrates a magnet pack 34 positioned behind a sputtering target 25 in the apparatus 20 of FIG. 3. A target backing plate and cooling jacket 67, formed of stainless steel or other non-magnetic material, lies between the magnet pack 34 and the back of the target 25. The magnet pack 34 is designed to produce a static magnetic field 60 of the same shape as that produced by the magnet pack of U.S. Pat. No. 6,458,252, but of substantially lower strength. A field strength of about 40 Gauss at the sputtering surface of an uneroded target 25 is suitable. This allows the magnet pack 34 to be lifted from the target 25 slightly to reduce the field strength to the range of 20-30 Gauss for deposition, and then removed farther from the target 25 to reduce the field strength to 0 to 10 Gauss for etching. Reduction of the field strength from that of the magnet from U.S. Pat. No. 6,458,252 is achieved primarily by using magnets of lower strength. But preservation of the field shape when reducing the magnet strength is achieved by further reconfiguration of the individual magnets.

The magnet pack 34 includes an inner ring magnet 61, a center ring magnet 62 and an outer ring magnet 63. Each of the rings is formed of a plurality of magnet segments one-half inches in width around the circumference of the magnet pack 34. The segments of the inner ring magnet 61 are ⅜ inch long in the direction parallel to the sputtering surface of the target 25, which is the orientation of the polar axis of the inner ring magnet 61. The inner ring magnet 61 is illustrated with the N-pole facing inward toward the axis of the target 25. The thickness of the inner ring magnet 61, the direction perpendicular to the surface of the target 25, is 4 mm.

The segments of the center ring magnet 62 are also ⅜ inch long in the direction parallel to the sputtering surface of the target 25, which is also the orientation of the polar axis of the center ring magnet 62. The inner ring magnet 62 is illustrated with its S-pole facing inward toward the axis of the target 25. The thickness of the center ring magnet 62, the direction perpendicular to the surface of the target 25, is ¼ inch. The segments of the outer ring magnet 63 are one-half inch long in the direction parallel to the sputtering surface of the target 25, which is perpendicular to the orientation of the polar axis of the outer ring magnet 63. The outer ring magnet 63 is illustrated with its S-pole facing toward the target 25. The thickness of the outer ring magnet 63, the direction perpendicular to the surface of the target 25, is 4 mm.

The pole designations N and S can be the opposite of those described above. Further, the dimensions given above produce satisfactory magnets, but other configurations and dimensions can be designed to produce a static magnetic field that will satisfy the objectives of the invention.

The magnet pack 34 also includes a soft-iron magnetic 66 yoke at the back thereof, which may include the same yoke used with the magnet pack of U.S. Pat. No. 6,458,252, which may be supplemented by providing a soft-iron magnetic-material insert 68 to conform to the magnets 61-63, which are smaller than those of the patent. Because the magnets 61-63 are weaker than those of the patent, the thickness of the yoke 66 in the direction perpendicular to the surface of the target 25, may be reduced.

Figure 9A:
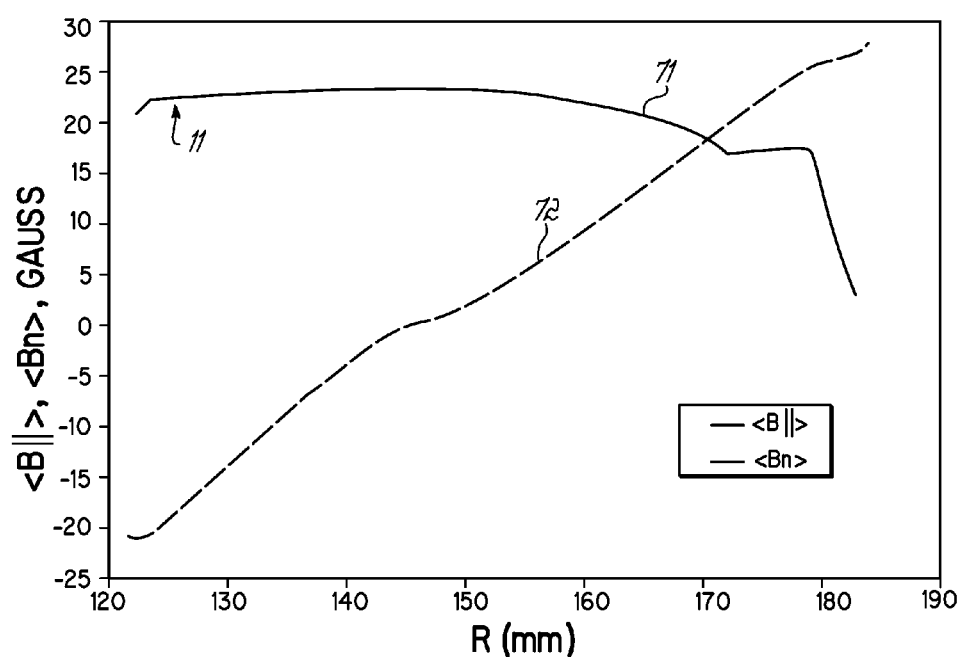
FIG. 9A is a graph of tangential and normal static magnetic field components along the target surface with the magnet configuration of FIG. 9.

FIG. 9A contains a graph of the field strength of the magnet pack 34, illustrated as curve 71, measured at the surface of the target 25 as a function of target radius, with the position of the magnet pack 34 relative to the target 25 adjusted for the deposition portions of a cycle. It shows the component of the field that is parallel to the surface of the target 25, which is the component beneficial for electron confinement during deposition, being approximately 20 Gauss across the target's 123-184 mm radius. Curve 72 represents the field component normal to the target surface. It should be noted that, for etching, the total static magnetic field, which is the vector sum of curves 71 and 72, is minimized by further movement of the magnet pack 34 away from the target 25.

For one example of the magnet 61-63, the total field strengths of the magnet segments of the inner, center and outer ring magnets 61-63 may be 805 Gauss, 832 Gauss and 569 Gauss, respectively. On such magnet segments, the localized field measurements at the magnet poles may be as follows: The minimum field measured at the center of the pole surface of the segments 81-83 of the inner, center and outer magnets 61-63 may be 594 Gauss, 613 Gauss and 427 Gauss, respectively. The maximum field measured at the midpoint 84-86 on the edge of a polar face of the segment may be 890 Gauss, 994 Gauss and 777 Gauss, respectively, as illustrated in FIG. 9.

Alternatively, or in addition, a linear lift up motion system for the magnet pack may be provided using suitable actuators, for example, pneumatic or electric. Appropriate actuators can be selected from many commercial vendors at the current market. The actuators should be selected to provide a stroke of up to approximately 100 mm, or to what is sufficient to move the magnet pack into a position that will result in the static magnetic field at the target surface being not more than about 10 Gauss. The actuators would operate to move the magnet pack away from the target at the end of the deposition portion of the cycle and before the etch portion of the cycle, and to move the magnet pack back to the target after the etch portion of the cycle and before the next deposition portion of a cycle. For safety and control purposes, the actuators may be provided with position sensors, such as magnetic reed switches for example, which should be magnetically shielded from the magnet pack. Sensors may also be in the form of solid state optical sensors or inductive proximity switches. The actuators preferably would allow fully automatic operation. Use of such actuators is well known to system engineers in the field. The linear actuators provide motion of the magnet pack assembly through bores which are connected to the yoke of the magnet pack. The actuators are preferably mounted between the magnet assembly and a robust flange on, or directly to, the chamber wall or frame.

The switchable static magnetic field is most advantageous if it provides some flexibility that allows the apparatus controller to set the relative influence of the static magnetic field on the respective deposition and etch modes differently, depending on the process. This may include variable magnet positions or flexible duty cycles, for example, which can vary the amount of the confined plasma at the target surface comparing to total confinement with annular magnet pack that can be changed at any time by the controlling program, or even controlled within one cycle to compensate for another cause of non-uniformities, such as gas flow skew, coil asymmetry, etc.

The target may have a backplane that provides cooling channels for the target. A mechanical and packaging consideration is that any connections to the target, such as water cooling stubs, DC power connection, sensors, etc., do not obstruct the motion of the magnet pack.

The magnet pack may be formed in sectors that effectively rotate the static magnetic field envelope, thereby enabling the field to be switched between a configuration that serves the deposition portion of the cycle and a configuration that serves the etching portion of the cycle. The switching need not literally occur between the end of one portion of a cycle, deposition or etch, and the beginning of the next portion, but may be timed or operated in a duty cycle that produces a desired average effect.

Advantages in deposition and etch uniformity are provided in the embodiments of the invention that enable the change of the static magnetic field strength of cathode magnets between a deposition mode and an etch mode. In one preferred embodiment, during the etch step, the field is established in such a way that its strength at the substrate is less than about 10 Gauss, and preferably 0 Gauss. Stronger static magnetic fields of more than about 10 Gauss at the substrate tend to concentrate the etch plasma at certain areas of the substrate and tend to cause a non-uniform etch. With an iPVD apparatus of the type illustrated in FIG. 3, such concentration of the plasma, if it occurs, would tend to occur over the central portion of the substrate. A weak or zero static magnetic field at the substrate allows the plasma to be distributed more evenly over the surface of the substrate, bringing the module into a configuration that closely resembles a dedicated plasma etch module.

Achieving a weak or zero static magnetic field, for example less than 10 Gauss, in the process volume 29 during the etch step is desirable and can be accomplished in the several ways discussed above. In a preferred embodiment, a magnet configuration behind the target is designed to produce a static magnetic field of less than 200 Gauss, preferably less than about 150 Gauss, preferably at least 20-30 Gauss, but possibly even 0 Gauss, at the target surface for deposition. By increasing the distance between the magnets and target, rotating portions of the magnets, or otherwise altering the magnet position or configuration, the field at the substrate surface is reduced during etching to less than 150 Gauss, preferably less than 50 Gauss, to produce a field of less than 30 Gauss, and preferably to less than 10 Gauss in the process volume. A field of 40 Gauss at the target surface is enough to produce more than worthwhile improvement. A mechanism that lifts the magnets from the targets during etching has been found effective. A lift mechanism may be provided that lifts the magnets a distance of from 0 to 60 mm, depending on the strength of the static magnetic field of the target surface. The magnets may alternatively be rotated to change the resultant field strength.

Additionally or in the alternative, a magnetic shunt can be used, alone or in combination with moving the magnets. The shunt would make physical contact with the magnets, and can be made to do so at the end of a lifting stroke. Typical shunt material would be soft iron with a large value of saturation magnetization.

Figure 9B:
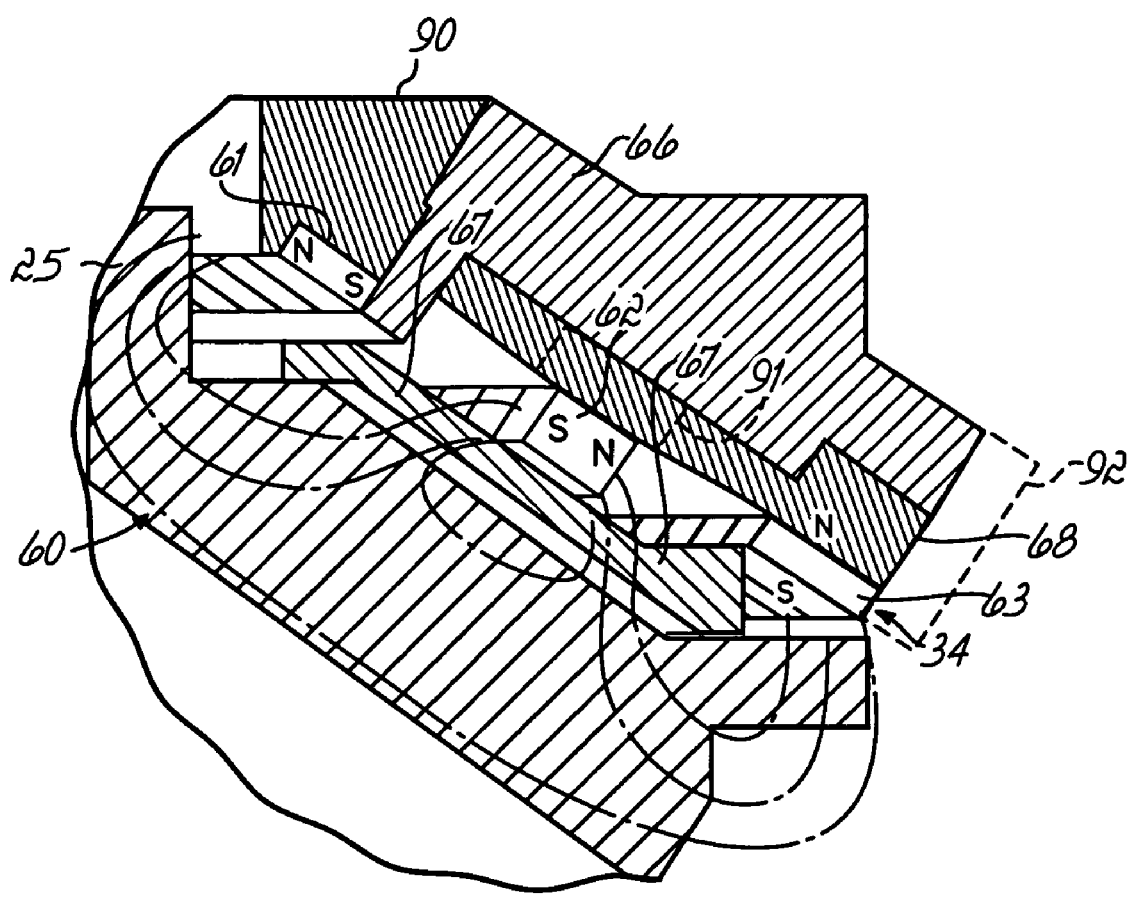
FIG. 9B is a cross-sectional diagram, similar to FIG. 9, of a target magnet arrangement employing a magnet shunt to further lower the magnetic field strength in the process space of the chamber.

FIG. 9B illustrates the magnet pack 60 of FIG. 9 having a magnet shunt element 90 used to additionally weaken the magnetic field strength in the process volume of the chamber. The shunt 90 is an annular piece of material with at least some permeability, usually, but not necessarily with a relatively high saturation, that redirects field lines from the magnets, such as ring magnet 61, from the face of the target 25, such as through the yoke 66. In this manner, the shunt 90 absorbs or otherwise modifies magnetic energy from the magnet pack 60, resulting in an attenuation of the field inside of the process volume.

Accordingly, where a magnet pack 60 has been substituted for an iPVD source magnet pack to reduce the magnetic field, measured at the target surface from, for example, 150 Gauss to about 40 Gauss, the addition of the shunt 90 may be used to further reduce the field another 30 percent or more. This particular shunt 90, as positioned adjacent the inner magnet 61, reduces the field at the target surface approximately 50 percent near the inner magnet, approximately 30 percent near the middle magnet 62, and approximately 15 percent near the outer magnet 63. Other shunts may be added, for example at locations 91 and 92, to further reduce and reshape the magnetic field and to adjust the field uniformity across the target surface.

Another alternative embodiment, which can be used instead of or in addition to the others discussed above, involves the use of electromagnets behind the target. Such electromagnets would be activated during the deposition step to achieve a field strength of from 0 to about 3000 Gauss, and substantially deactivated or turned off during the etch step to achieve fields of from 0 to about 10 Gauss. Both electromagnets and permanent magnets can be used in combination. By manipulating the static magnetic field generated by the electromagnet, the static magnetic field strength for and during sputtering and for and during etching can be individually adjusted and optimized.

An alternative embodiment uses shunt elements that are moved in and out of place by mechanical motion generators to shunt and change the static magnetic field strength of the static magnetic field generated by permanent magnets or electromagnets or a combination of them, to result in different resulting static magnetic fields during the etch and deposition cycles. The shunt material is made of a soft magnetic material such as soft iron or ferrite.

Another alternative embodiment is to rotate the magnets about 90 degrees out of plane during the etch step. The rotation may be such that, for example, the axis that passes through the north and south poles of the magnet is rotated by about 90 degrees to achieve a field of less than about 10 Gauss during the etch step. A range of rotation angles, for example, from 25 degrees to 180 degrees, can be effective.

It is possible to achieve the end result by many different combinations of the alternative embodiments outlined above.

The ability to use weak static magnetic fields during the deposition step and still achieve high density plasmas with high metal ion fraction and good deposition uniformity is a byproduct of the apparatus of the type of FIG. 3. Such a source does not rely on a strong static magnetic field to achieve metal ionization and to strike a dense plasma. In such an iPVD apparatus, a static magnetic field of, for example, 20 to 30 Gauss, which is substantially lower than is typically used for iPVD alone, may be used to produce an optimum erosion profile. For optimum etching, a static magnetic field of from 0 to 10 Gauss is preferable.

Those skilled in the art will appreciate that deletions, additions and modifications can be made to the above described embodiments without departing from the principles of the invention. Therefore, the following is claimed:

We claim:

1. An ionized physical vapor deposition (IPVD) apparatus comprising:
   a vacuum chamber configured to perform an ionized physical vapor deposition on a substrate therein, over a pressure range of at least from approximately 1 mTorr to over 30 mTorr;
   a sputtering target in the chamber at one end of the chamber and having a target surface facing the chamber;
   a DC power source coupled to the target;
   a substrate support in the chamber spaced from the sputtering target and having a substrate support surface facing the sputtering target;
   a bias source connected to the substrate support and configured to impose a negative bias to a substrate on the support;
   a sputtering gas source and a vacuum pump coupled to the chamber to maintain sputtering gas in the chamber at a vacuum pressure level;
   an ICP source operable to inductively couple RF energy into the chamber between the target and the substrate support to form a high density plasma in the chamber to ionize sputtering gas to contribute to the sputtering of material from the target during deposition modes, to etch the substrate during etch modes, and to ionize sputtered material for deposit onto the substrate;
   a permanent magnet magnetron assembly located in a fixed position behind the sputtering target and having a static magnetic field extending between the target and the substrate support having a static magnetic field strength of at least 20 Gauss at the sputtering surface of the sputtering target and of not more than approximately 10 Gauss at the substrate support surface; and
   a controller programmed to operate the apparatus sequentially, with a single substrate on the substrate support and without opening the chamber, in a plurality of cycles that each includes at least one deposition mode followed by at least one etch mode, wherein:
      the DC power source energizes the target to provide sputtered material into the chamber during deposition modes,
      the bias source imposes a deposition mode bias to a substrate on the support during deposition modes and an etch mode bias to the substrate on the support during etch modes that is greater in magnitude than the deposition mode bias, and
      the RF energy from the ICP source produces ions of sputtering gas to sputter material from the target during deposition modes and to etch the substrate during etch modes, and produces ions of sputtered material to deposit by IPVD onto the substrate during deposition modes.

2. The ionized physical vapor deposition apparatus of claim 1 wherein:
   the permanent magnet magnetron assembly includes magnetic shunt structure positioned and configured to reduce the static magnetic field produced by the magnetron magnet assembly inside the chamber.

3. The ionized physical vapor deposition apparatus of claim 1 wherein:
   the sputtering target is an annular target having an opening at its center;
   the ICP source includes an RF antenna located in the opening of the sputtering target; and
   the permanent magnet magnetron assembly includes one or more annular magnet rings located behind the sputtering target and surrounding the RF antenna.

4. The ionized physical vapor deposition apparatus of claim 3 wherein:
   the permanent magnetron magnet assembly includes a moveable part thereof configured to selectively block, during etch modes, a portion of the static magnetic field that extends from the magnet assembly to the substrate support during deposition modes.

5. The ionized physical vapor deposition apparatus of claim 3 wherein the controller is further programmed to:
   operate the apparatus in the deposition modes at a pressure of at least approximately 30 mTorr while sputtering coating material from the target into the high density plasma to ionize the material, and depositing the ionized material with a high degree of directionality substantially normal to and onto the substrate; and
   operate the apparatus in the etch modes at a pressure of less than approximately 10 mTorr to etch deposited material from the substrate without substantial sputtering of material from the target.

6. The ionized physical vapor deposition apparatus of claim 5 wherein the controller is further programmed to:
   operate the apparatus to move the substrate holder to a position closer to the target during the deposition modes and to a position farther from the target during etch modes.

7. The ionized physical vapor deposition apparatus of claim 1 wherein the controller is further programmed to:
   operate the apparatus to move the substrate holder to a position closer to the target during the deposition modes and to a position farther from the target during etch modes.

8. The ionized physical vapor deposition apparatus of claim 1 wherein the controller is further programmed to:
   operate the apparatus in the deposition modes at a pressure of at least approximately 30 mTorr while sputtering coating material from the target into the high density plasma to ionize the material, and depositing the ionized material with a high degree of directionality substantially normal to and onto the substrate; and
   operate the apparatus in the etch modes at a pressure of less than approximately 10 mTorr to etch deposited material from the substrate without substantial sputtering of material from the target.

9. An ionized physical vapor deposition (IPVD) apparatus comprising:
   a vacuum chamber configured to perform an ionized physical vapor deposition on a substrate therein, over a pressure range of from approximately 1 mTorr to over 30 mTorr;
   a sputtering target in the chamber at one end of the chamber and having a target surface facing the chamber;
   a DC power source coupled to the target;
   a substrate support in the chamber spaced from the sputtering target and having a substrate support surface facing the sputtering target;

a bias source connected to the substrate support and configured to impose a negative bias to a substrate on the support;

a sputtering gas source and a vacuum pump coupled to the chamber to maintain sputtering gas in the chamber at a vacuum pressure level;

an ICP source operable to inductively couple RF energy into the chamber between the target and the substrate support to form a high density plasma in the chamber to ionize sputtering gas to contribute to the sputtering of material from the target during deposition modes, to etch the substrate during etch modes, and to ionize sputtered material for deposit onto the substrate;

a permanent magnet magnetron assembly located behind the sputtering target, the magnetron assembly having one or more parts thereof physically moveable relative to the sputtering target between a first position at which the magnetic field at the target surface has a strength of at least 30 Gauss and is effective to form the magnetic tunnel over the sputtering surface of the sputtering target that confines plasma at said sputtering surface, and a second position at which the magnetic field strength at the surface of a substrate on the substrate support is not more than approximately 10 Gauss; and a controller programmed to operate the apparatus sequentially, with a single substrate on the substrate support and without opening the chamber, in a plurality of cycles that each includes at least one deposition mode, followed by at least one etch mode, wherein:

the DC power source energizes the target to provide sputtered material into the chamber during deposition modes, the bias source imposes a deposition mode bias to a substrate on the support during deposition modes and an etch mode bias to the substrate on the support during etch modes that is greater in magnitude than the deposition mode bias, the RF energy from the ICP source produces ions of sputtering gas to sputter material from the target during deposition modes and to etch the substrate during etch modes, and produces ions of sputtered material to deposit by IPVD onto the substrate during deposition modes, and the magnetron magnet assembly or one or more parts thereof is moved to the first position during deposition modes and to the second position during etch modes.

10. The ionized physical vapor deposition apparatus of claim 9 wherein:

the one or more parts of the magnetron assembly include physically moveable magnetic shunt structure positioned and configured to reduce the static magnetic field produced by the magnetron magnet assembly inside the chamber during etch modes.

11. The ionized physical vapor deposition apparatus of claim 9 wherein:

the one or more parts of the magnetron assembly include physically moveable magnetic shunt structure positioned and configured to change the static magnetic field produced by the magnetron magnet assembly inside the chamber, between the first magnetic field strength during deposition modes and the second magnetic field strength during etch modes that is lower than the first magnetic field strength in the chamber.

12. The ionized physical vapor deposition apparatus of claim 9 wherein:

the one or more parts of the magnetron assembly include physically moveable magnetic shunt structure positioned and configured to change the static magnetic field produced by the magnetron magnet assembly inside the chamber, between the deposition modes and the etch modes.

13. The ionized physical vapor deposition apparatus of claim 9 wherein:

the sputtering target is an annular target having an opening at its center;

the ICP source includes an RF antenna located in the opening of the sputtering target; and the permanent magnet magnetron assembly includes one or more annular magnet rings located behind the sputtering target and surrounding the RF antenna when said one or more parts are in said first position.

14. An ionized physical vapor deposition (IPVD) process method comprising:

sealing a substrate on a substrate support within a vacuum chamber of a processing apparatus and performing an ionized physical vapor deposition process to deposit a layer of conductive material on surfaces of the substrate having high aspect ratio submicron features thereon by operating the apparatus, without opening the chamber, in a plurality of cycles that each includes a deposition mode followed by an etch mode;

the deposition modes each including:

positioning a permanent magnet magnetron assembly in a first position behind a sputtering target of coating material and forming therewith a magnetic tunnel over a sputtering surface of the target by a static magnetic field having a static magnetic field strength of more than 30 Gauss at the sputtering surface of the target and being of approximately 20 Gauss or more at the surface of the substrate on the substrate support, and sputtering material from the sputtering target enclosed in the magnetic tunnel, ionizing at least some of the sputtered material in a high density plasma energized in the chamber by RF energy from an RF source, and biasing the substrate to direct the ionized coating material onto the substrate to deposit the coating material on the substrate by IPVD; and the etch modes each including:

physically moving the magnet assembly or one or more components thereof from said first position to a second position at which the static magnetic field strength produced by the magnet assembly is not more than approximately 10 Gauss at the surface of a substrate on the substrate support, and reducing the sputtering of material from the target and biasing the substrate to attract ions from the plasma onto the surface of the substrate to remove from the surface of the substrate during etch modes material that was deposited during deposition modes.

15. The ionized physical vapor deposition method of claim 14 further comprising:

changing of the static magnetic field strength between deposition and etch modes by rotating permanent magnets of the magnet assembly between a deposition-mode position in the vicinity of the target during deposition modes and an etch-mode position to reorient the polar axes of the magnets by an angle of from 35 to 180 degrees relative to the deposition-mode position of the polar axes of the magnets.

16. The method of claim 14 further comprising:

inductively coupling RF energy into the vacuum chamber to create a high density plasma therein to produce ions of coating material to be deposited by IPVD onto the substrate during each deposition mode and to produce ions of processing gas for etching the substrate during the etch mode; and controlling the apparatus to operate at power and pressure parameters that are different during deposition modes than during etch modes, including controlling the apparatus to operate at a first processing pressure in a deposition mode, then, without opening the chamber, controlling the apparatus to operate at a second processing pressure, then controlling the apparatus to operate at the first processing pressure in another deposition mode.

17. The method of claim 16 for depositing coatings on semiconductors having sub-micron, high aspect ratio features wherein the ionized physical vapor deposition method further comprises:

operating the apparatus in a deposition mode at a pressure of at least approximately 30 mTorr while sputtering coating material from the target into the high density plasma to ionize the material, and depositing the ionized material with a high degree of directionality substantially normal to and onto the substrate; and operating the apparatus in an etch mode at a pressure of less than approximately 10 mTorr and with a bias on the substrate having a magnitude of more than approximately 100 volts without sputtering substantial material from the target.

18. An ionized physical vapor deposition processing apparatus having a controller programmed to operate the apparatus according to the method of claim 17.

19. The method of claim 17 further comprising:

changing from a deposition mode to an etch mode by changing bias power on the substrate to facilitate a net etching during the etch mode of deposited material from at least certain areas of the substrate by ions from the plasma; and changing from an etch mode to a deposition mode by changing the bias power on the substrate to facilitate deposition.

20. The method of claim 19 further comprising:

switching DC power to the sputtering target between a sputtering power level during deposition modes and a different power level during etch modes.

21. The method of claim 20 further comprising:

forming a high density plasma in the chamber by coupling RF energy into the chamber to ionize sputtered coating material for deposit by IPVD onto the substrate during deposition modes and to produce ions of processing gas for etching the substrate during etch modes; and coupling RF energy into the chamber at one power level during deposition modes and at a different power level during etch modes.

22. The method of claim 21 further comprising:

positioning the substrate at one position relative to the chamber during deposition modes and repositioning the substrate at another position relative to the chamber during etch modes.

23. The method of claim 14 further comprising:

changing from a deposition mode to an etch mode by changing bias power on the substrate to facilitate a net etching during the etch mode of deposited material from at least certain areas of the substrate by ions from the plasma; and changing from an etch mode to a deposition mode by changing the bias power on the substrate to facilitate deposition.

24. The method of claim 14 further comprising:

carrying out the etch mode by sputtering with ions from the plasma by operating the apparatus under parameters that cause at least one of:

at least partially removing deposited material that overhangs edges of the features on the substrate, at least partially removing deposited material from the bottoms of the features, or resputtering deposited material from the substrate onto sidewalls of the features.

25. The method of claim 14 further comprising:

switching DC power to the sputtering target between deposition and etch modes.

26. The method of claim 14 further comprising:

forming a high density plasma in the chamber to ionize coating material to deposit ions of coating material onto the substrate during deposition modes and to produce ions for etching the substrate during etch modes; and positioning the substrate at one position relative to the chamber during deposition modes and repositioning the substrate at another position relative to the volume during etch modes.

27. The method of claim 14 further comprising:

forming a high density plasma in the chamber to ionize coating material to deposit ions of coating material by IPVD onto the substrate during deposition modes and to produce ions for etching the substrate during etch modes; and positioning the substrate relative to the chamber during deposition modes and repositioning the substrate closer to the chamber during etch modes.

28. The method of claim 14 further comprising:

forming a high density plasma in the chamber by coupling RF energy into the volume to ionize sputtered coating material for deposit by IPVD onto the substrate during deposition modes and to produce ions for etching the substrate during etch modes; and coupling RF energy into the chamber at one power level during deposition modes and at a different power level during etch modes.

29. The method of claim 14 further comprising:

forming a high density plasma in the chamber by coupling RF energy into the volume to ionize sputtered coating material for deposit by IPVD onto the substrate during deposition modes and to produce ions for etching the substrate during etch modes; and coupling RF energy into the volume at one power level during deposition modes and at a lower power level during etch modes.

30. An ionized physical vapor deposition processing apparatus having a controller programmed to operate the apparatus according to the method of claim 14.

* * * * *